(12) United States Patent
Briggs et al.

(10) Patent No.: US 8,854,824 B2
(45) Date of Patent: Oct. 7, 2014

(54) MODULAR UPS

(75) Inventors: James Briggs, Nashua, NH (US); David Schuttler, W. Townsend, MA (US); Srdan Mutabdzija, Somerville, MA (US); Michael Falcinelli, Boxford, MA (US)

(73) Assignee: Schneider Electric IT Corporation, West Kingston, RI (US)

( * ) Notice: Subject to any disclaimer, the term of this patent is extended or adjusted under 35 U.S.C. 154(b) by 0 days.

(21) Appl. No.: 13/453,487

(22) Filed: Apr. 23, 2012

(65) Prior Publication Data

US 2013/0069504 A1  Mar. 21, 2013

Related U.S. Application Data

(60) Continuation of application No. 12/123,028, filed on May 19, 2008, now Pat. No. 8,162,417, which is a division of application No. 10/763,813, filed on Jan. 23, 2004, now Pat. No. 7,379,305.

(51) Int. Cl.
| | |
|---|---|
| G06F 1/16 | (2006.01) |
| G06F 1/18 | (2006.01) |
| H05K 5/02 | (2006.01) |
| H05K 7/18 | (2006.01) |
| H05K 5/00 | (2006.01) |
| H05K 7/14 | (2006.01) |
| G06F 1/30 | (2006.01) |
| H02J 9/06 | (2006.01) |

(52) U.S. Cl.
CPC .............. *H05K 5/0247* (2013.01); *G06F 1/189* (2013.01); *H05K 7/18* (2013.01); *H02J 9/06* (2013.01); *H05K 5/0021* (2013.01); *H05K 7/1424* (2013.01); *G06F 1/30* (2013.01); *G06F 1/181* (2013.01)
USPC ....................................................... 361/727

(58) Field of Classification Search
USPC ......................................................... 361/727
See application file for complete search history.

(56) References Cited

U.S. PATENT DOCUMENTS

| | | | |
|---|---|---|---|
| 3,007,129 | A | 10/1961 | Nielsen |
| 4,065,711 | A | 12/1977 | Kawabata |

(Continued)

FOREIGN PATENT DOCUMENTS

| | | |
|---|---|---|
| CN | 1121077 C | 4/1996 |
| EP | 0340952 A1 | 11/1989 |

(Continued)

OTHER PUBLICATIONS

European Search Report for EP05711807.7 issued Apr. 28, 2009.

(Continued)

*Primary Examiner* — Lisa Lea Edmonds
(74) *Attorney, Agent, or Firm* — Lando & Anastasi, LLP

(57) ABSTRACT

A modular UPS system is provided wherein UPS systems may be constructed using a number of different frame components. In one example, a core UPS frame is provided that can accept different combinations of power and battery modules, and an extension frame is provided that can be combined with the core frame to provide a larger UPS system. According to one example, both the core and extension frame types may be used in either a standalone or rack-mounted configuration. Another aspect relates to packaging of UPS components such that the UPS frame need not include serviceable items. In another aspect, a rail system is provided that allows for easier installation of heavy components into rack-mount systems.

15 Claims, 21 Drawing Sheets

(56) References Cited

U.S. PATENT DOCUMENTS

| | | | |
|---|---|---|---|
| 4,595,248 A | 6/1986 | Brown | |
| 4,665,322 A | 5/1987 | Eishima et al. | |
| 4,673,826 A | 6/1987 | Masson | |
| 4,709,202 A | 11/1987 | Koenck et al. | |
| 4,763,013 A | 8/1988 | Gvoth, Jr. et al. | |
| 4,816,982 A | 3/1989 | Severinsky | |
| 4,823,247 A | 4/1989 | Tamoto | |
| 4,827,151 A | 5/1989 | Okado | |
| 4,831,508 A | 5/1989 | Hunter | |
| 4,935,861 A | 6/1990 | Johnson, Jr. et al. | |
| 4,943,902 A | 7/1990 | Severinsky | |
| 4,964,029 A | 10/1990 | Severinsky et al. | |
| 4,980,812 A | 12/1990 | Johnson, Jr. et al. | |
| 5,017,800 A | 5/1991 | Divan | |
| 5,019,717 A | 5/1991 | McCurry et al. | |
| 5,045,989 A | 9/1991 | Higaki et al. | |
| 5,047,961 A | 9/1991 | Simonsen | |
| 5,057,698 A | 10/1991 | Widener et al. | |
| 5,089,974 A | 2/1992 | Demeyer et al. | |
| 5,099,410 A | 3/1992 | Divan | |
| 5,126,585 A | 6/1992 | Boys | |
| 5,148,043 A | 9/1992 | Hirata et al. | |
| 5,184,025 A | 2/1993 | McCurry et al. | |
| 5,227,262 A | 7/1993 | Ozer | |
| 5,241,217 A | 8/1993 | Severinsky | |
| 5,254,928 A | 10/1993 | Young et al. | |
| 5,272,382 A | 12/1993 | Heald et al. | |
| 5,281,955 A | 1/1994 | Reich et al. | |
| 5,291,383 A | 3/1994 | Oughton | |
| 5,302,858 A | 4/1994 | Folts | |
| 5,315,533 A | 5/1994 | Stich et al. | |
| 5,319,571 A | 6/1994 | Langer et al. | |
| 5,349,282 A | 9/1994 | McClure | |
| 5,382,893 A | 1/1995 | Dehnel | |
| 5,384,792 A | 1/1995 | Hirachi | |
| 5,442,558 A | 8/1995 | Kyrtsos et al. | |
| 5,457,377 A | 10/1995 | Jonsson | |
| 5,458,991 A | 10/1995 | Severinsky | |
| 5,465,011 A | 11/1995 | Miller et al. | |
| 5,477,091 A | 12/1995 | Fiorina et al. | |
| 5,504,415 A | 4/1996 | Podrazhansky et al. | |
| 5,510,690 A | 4/1996 | Tanaka et al. | |
| 5,516,303 A | 5/1996 | Yohn et al. | |
| 5,519,306 A | 5/1996 | Itoh et al. | |
| 5,563,493 A | 10/1996 | Matsuda et al. | |
| 5,579,197 A | 11/1996 | Mengelt et al. | |
| 5,602,462 A | 2/1997 | Stich et al. | |
| 5,610,368 A | 3/1997 | Smith | |
| 5,642,002 A | 6/1997 | Mekanik et al. | |
| 5,654,591 A | 8/1997 | Mabboux et al. | |
| 5,663,525 A | 9/1997 | Newman | |
| 5,684,671 A | 11/1997 | Hobbs et al. | |
| 5,684,686 A | 11/1997 | Reddy | |
| 5,801,921 A | 9/1998 | Miller | |
| 5,844,328 A | 12/1998 | Furst | |
| 5,901,057 A | 5/1999 | Brand et al. | |
| 5,940,274 A * | 8/1999 | Sato et al. | 361/725 |
| 5,982,652 A * | 11/1999 | Simonelli et al. | 363/142 |
| 6,002,237 A | 12/1999 | Gaza | |
| 6,018,456 A * | 1/2000 | Young et al. | 361/679.4 |
| 6,021,909 A | 2/2000 | Tang et al. | |
| 6,069,412 A | 5/2000 | Raddi et al. | |
| 6,121,695 A | 9/2000 | Loh | |
| 6,142,590 A | 11/2000 | Harwell | |
| 6,157,534 A * | 12/2000 | Gallagher et al. | 361/724 |
| 6,169,669 B1 | 1/2001 | Choudhury | |
| 6,181,103 B1 | 1/2001 | Chen | |
| 6,184,593 B1 | 2/2001 | Jungreis | |
| 6,201,319 B1 * | 3/2001 | Simonelli et al. | 307/26 |
| 6,274,950 B1 | 8/2001 | Gottlieb et al. | |
| 6,292,379 B1 | 9/2001 | Edevold et al. | |
| 6,310,783 B1 * | 10/2001 | Winch et al. | 361/797 |
| 6,317,348 B1 * | 11/2001 | Vackar | 363/144 |
| 6,318,783 B1 | 11/2001 | Knox | |
| 6,381,156 B1 | 4/2002 | Sakai et al. | |
| 6,400,043 B1 | 6/2002 | Batson et al. | |
| 6,400,591 B2 | 6/2002 | Reilly et al. | |
| 6,424,119 B1 | 7/2002 | Nelson et al. | |
| 6,433,444 B1 | 8/2002 | de Vries | |
| 6,445,088 B1 | 9/2002 | Spitaels et al. | |
| 6,455,954 B1 | 9/2002 | Dailey | |
| 6,462,961 B1 * | 10/2002 | Johnson et al. | 361/825 |
| 6,489,561 B2 | 12/2002 | Ziegler et al. | |
| 6,493,243 B1 | 12/2002 | Real | |
| 6,497,465 B1 | 12/2002 | Baker et al. | |
| 6,511,328 B2 | 1/2003 | Molus et al. | |
| 6,578,939 B1 | 6/2003 | Mayer | |
| 6,584,329 B1 | 6/2003 | Wendelrup et al. | |
| 6,626,300 B2 | 9/2003 | Kaminski et al. | |
| 6,654,265 B2 | 11/2003 | Sadler et al. | |
| 6,700,351 B2 | 3/2004 | Blair et al. | |
| 6,739,682 B2 | 5/2004 | Shih | |
| 6,773,285 B2 | 8/2004 | Bernat et al. | |
| 6,803,678 B2 | 10/2004 | Gottlieb et al. | |
| 6,932,443 B1 * | 8/2005 | Kaplan et al. | 312/213 |
| 6,983,212 B2 | 1/2006 | Burns | |
| 7,112,131 B2 * | 9/2006 | Rasmussen et al. | 454/184 |
| 7,188,916 B2 | 3/2007 | Silvestro et al. | |
| 7,350,884 B2 | 4/2008 | Palker et al. | |
| 7,379,305 B2 * | 5/2008 | Briggs et al. | 361/727 |
| 8,162,417 B2 * | 4/2012 | Briggs et al. | 312/223.2 |
| 2001/0009361 A1 | 7/2001 | Downs et al. | |
| 2001/0012579 A1 | 8/2001 | Vackar | |
| 2001/0040203 A1 | 11/2001 | Brock et al. | |
| 2002/0136042 A1 | 9/2002 | Layden et al. | |
| 2002/0172014 A1 | 11/2002 | Lung | |
| 2002/0195997 A1 | 12/2002 | Peek et al. | |
| 2003/0048647 A1 | 3/2003 | Sadler et al. | |
| 2003/0052644 A1 | 3/2003 | Nelson et al. | |
| 2003/0206021 A1 | 11/2003 | Laletin et al. | |
| 2003/0214507 A1 | 11/2003 | Mawatari et al. | |
| 2003/0220026 A1 | 11/2003 | Oki et al. | |
| 2004/0104706 A1 | 6/2004 | Ooi et al. | |
| 2004/0160210 A1 | 8/2004 | Bohne et al. | |
| 2004/0227441 A1 | 11/2004 | Wang et al. | |
| 2005/0001589 A1 | 1/2005 | Edington et al. | |
| 2005/0036248 A1 | 2/2005 | Klikic et al. | |
| 2005/0162019 A1 | 7/2005 | Masciarelli et al. | |
| 2005/0162129 A1 | 7/2005 | Mutabdzija et al. | |
| 2005/0162836 A1 * | 7/2005 | Briggs et al. | 361/724 |
| 2005/0164563 A1 | 7/2005 | Schuttler et al. | |
| 2008/0278889 A1 * | 11/2008 | Briggs et al. | 361/608 |

FOREIGN PATENT DOCUMENTS

| | | | |
|---|---|---|---|
| EP | 0574628 A1 | 12/1993 | |
| EP | 0575060 B1 | 9/1996 | |
| EP | 1291999 A1 | 3/2003 | |
| WO | 02/057925 A2 | 7/2002 | |

OTHER PUBLICATIONS

International Search Report for PCT/US2005/001929 mailed Apr. 4, 2006.
International Search Report for PCT/US2005/001992, mailed Jul. 20, 2005.
International Search Report for PCT/US2005/002010, mailed Aug. 2, 2005.
Invitation to Pay Additional Fees with Partial International Search Report for PCT/US2005/001992 mailed May 13, 2005.
Invitation to Pay Additional Fees with Partial International Search Report for PCT/US2005/002010 mailed May 13, 2005.
Invitation to Pay Additional Fees with Partial International Search Report for PCT/US2005/002027 mailed Apr. 7, 2006.
Patent Abstracts of Japan, vol. 1997, No. 12, Dec. 25, 1997 & JP 09 213423 A (Japan Aviation Electron Ind. Ltd.). Aug. 15, 1997, 1 pg.
Patent Abstracts of Japan, vol. 1999, No. 9, Jul. 30, 1999 & JP 11 097092 A (Fujitsu Denso Ltd.), Apr. 9, 1999, 1 pg.
Patent Abstracts of Japan, vol. 2003, No. 12, Dec. 5, 2003 & JP 2003 346940 A (NEC Commun Syst Ltd.), 1 pg.
Symmetra Brochure, "Server, Network and Telecom Power Solutions," pp. 1-20.

* cited by examiner

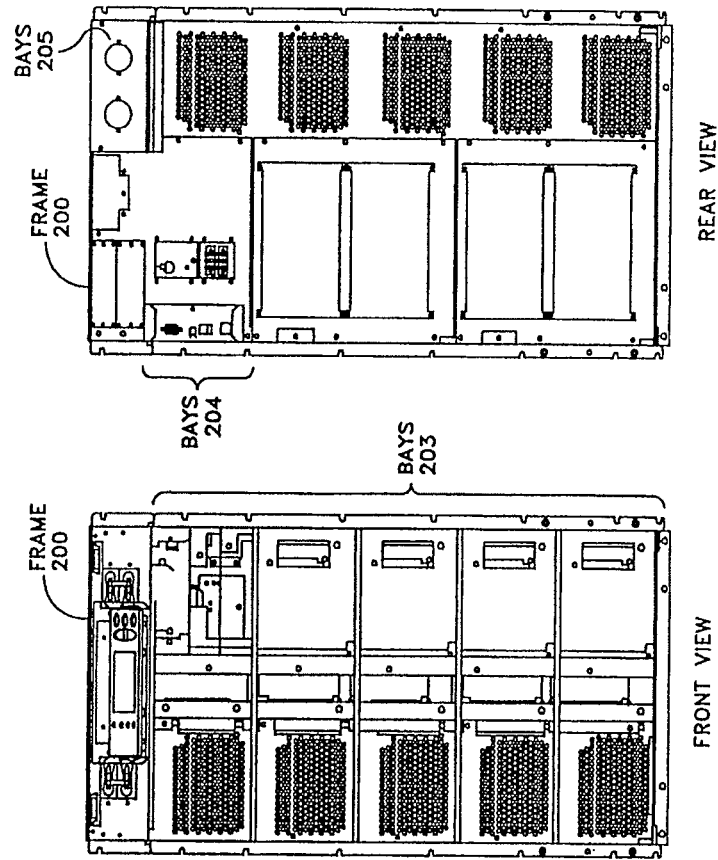
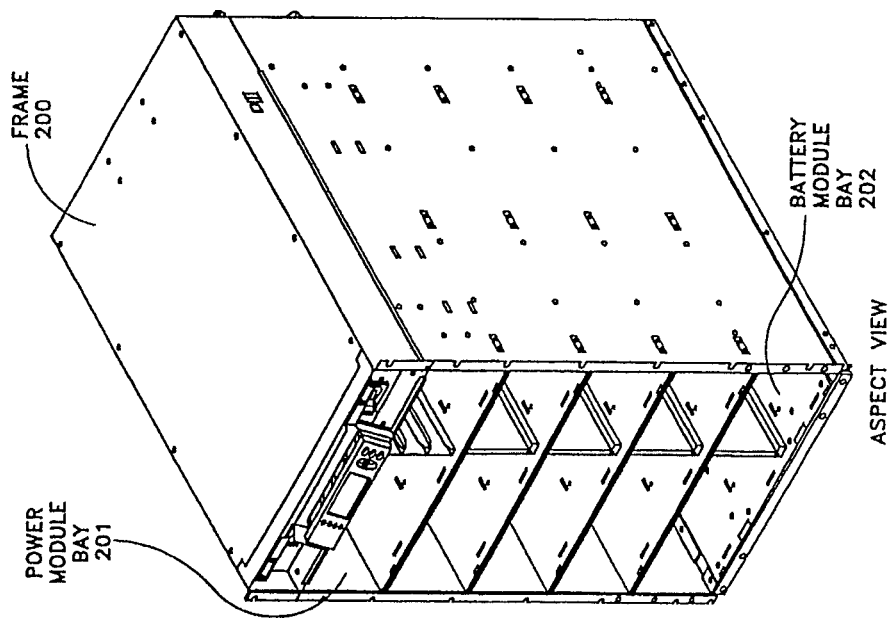

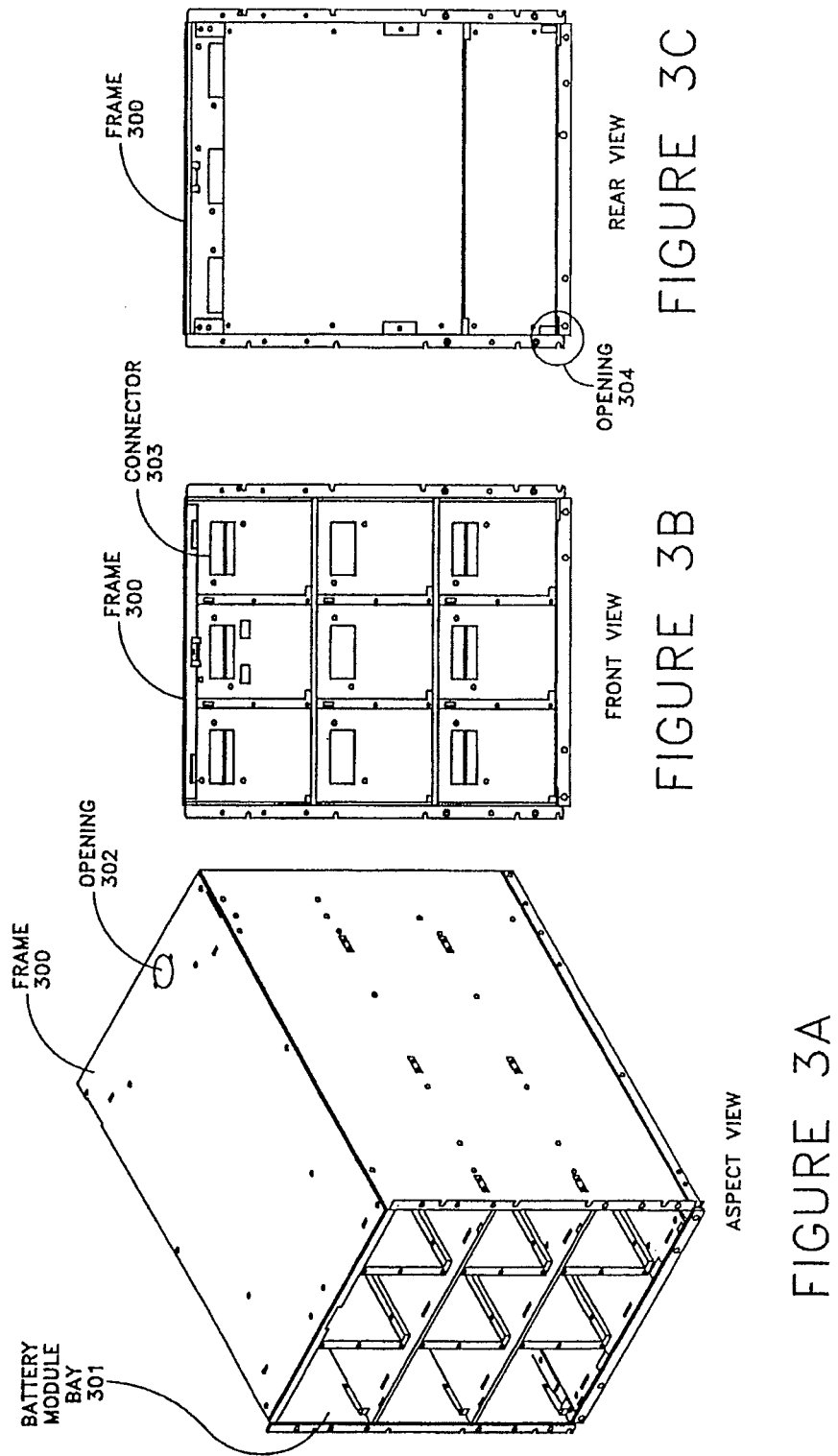

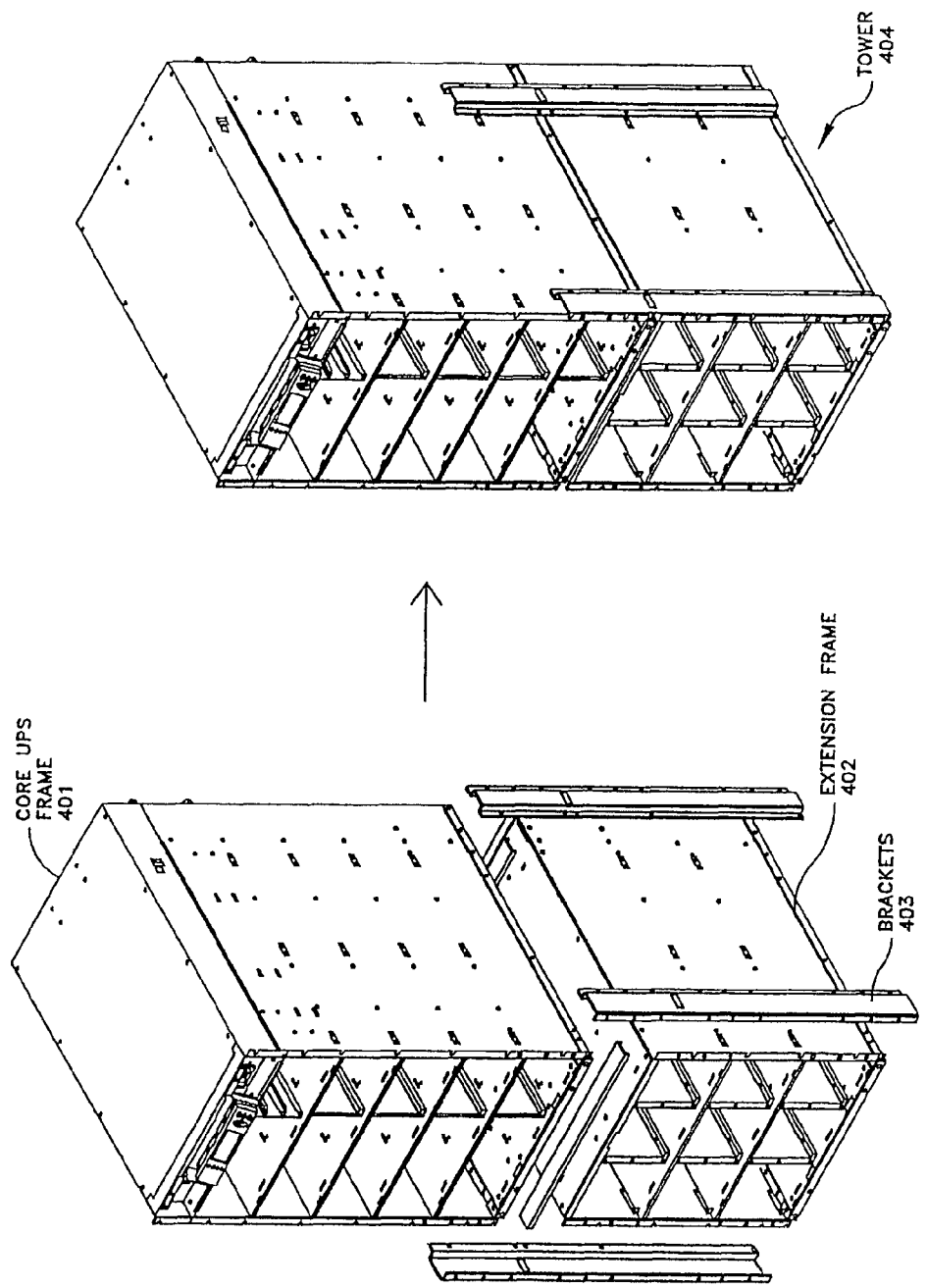

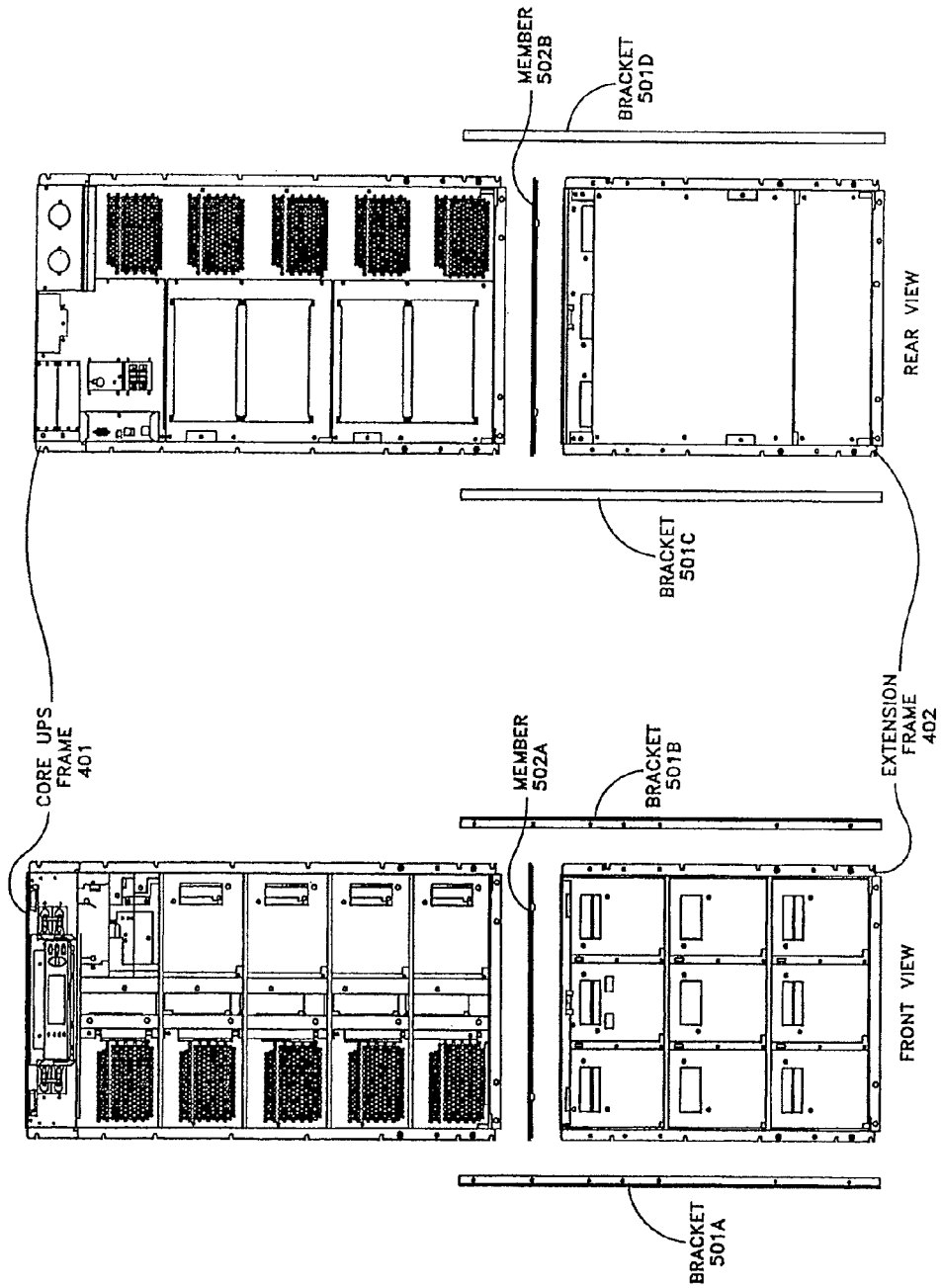

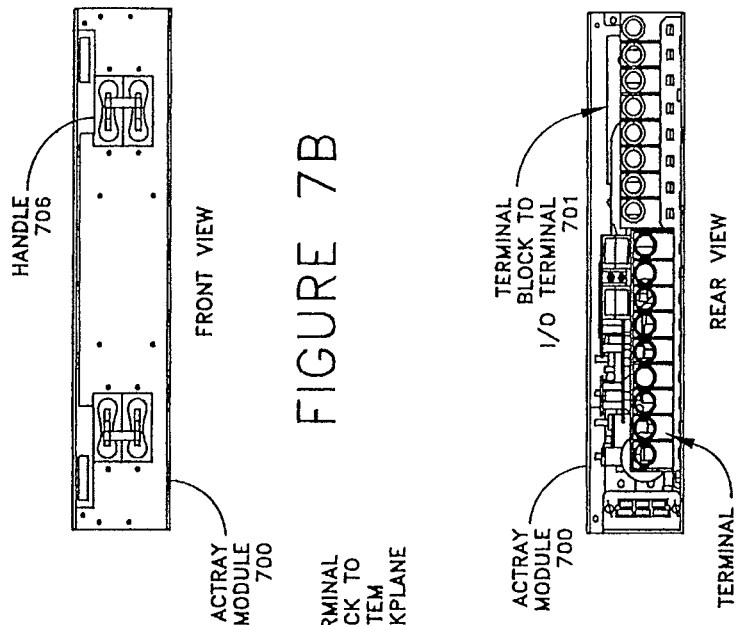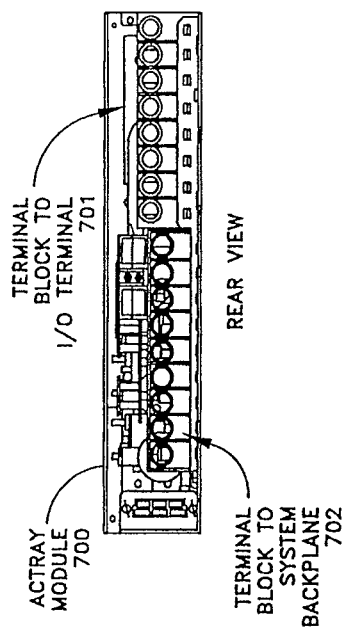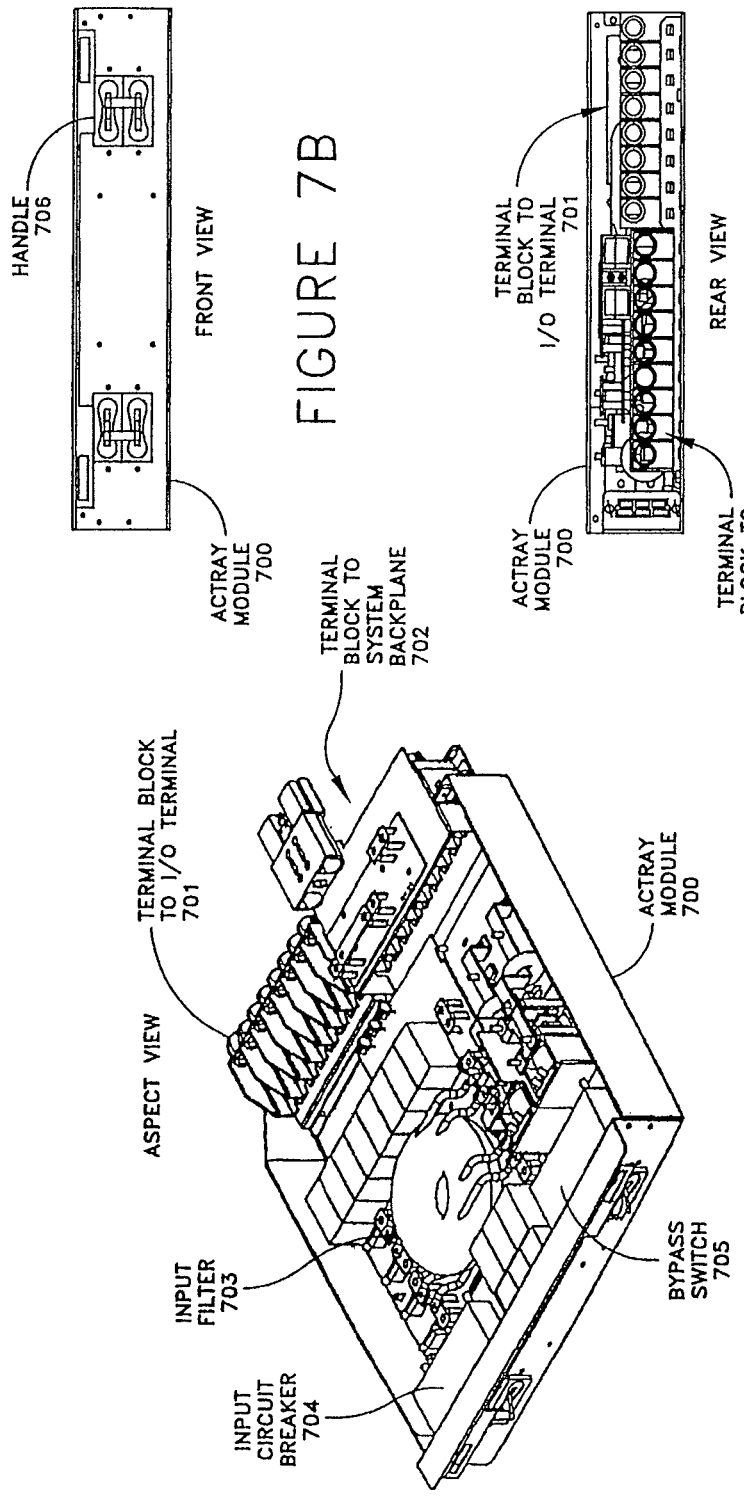

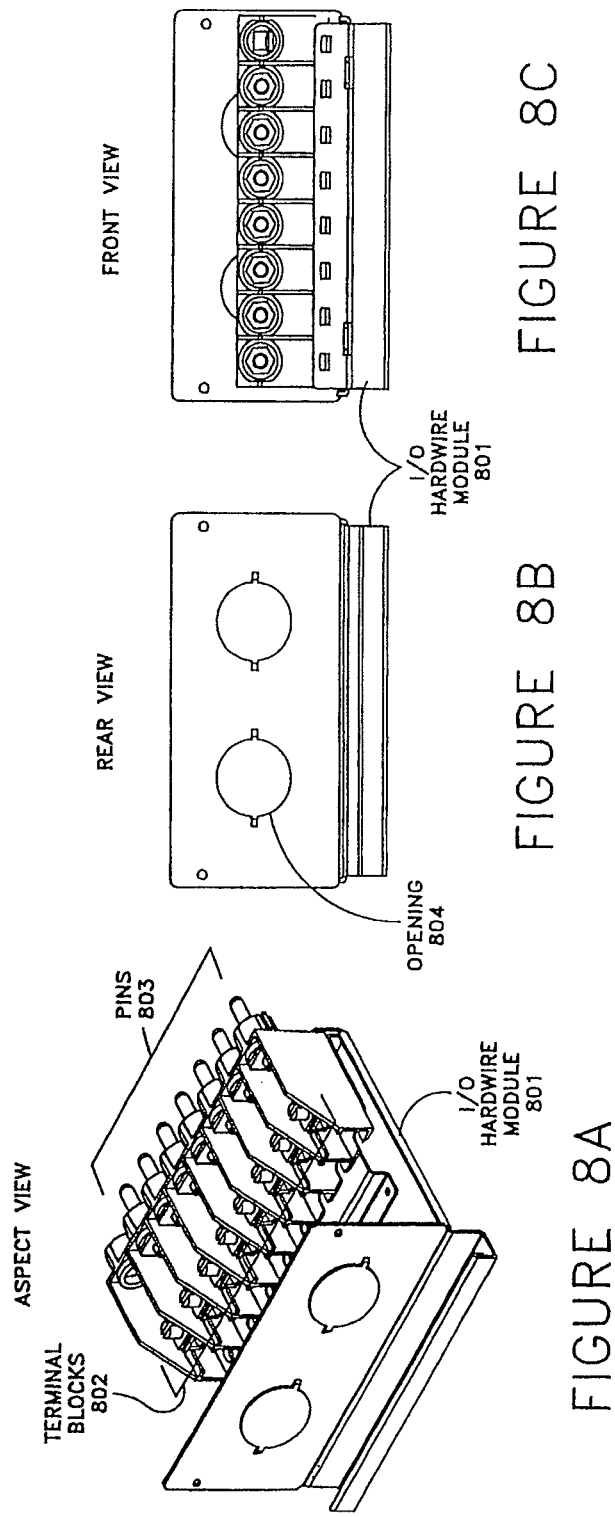

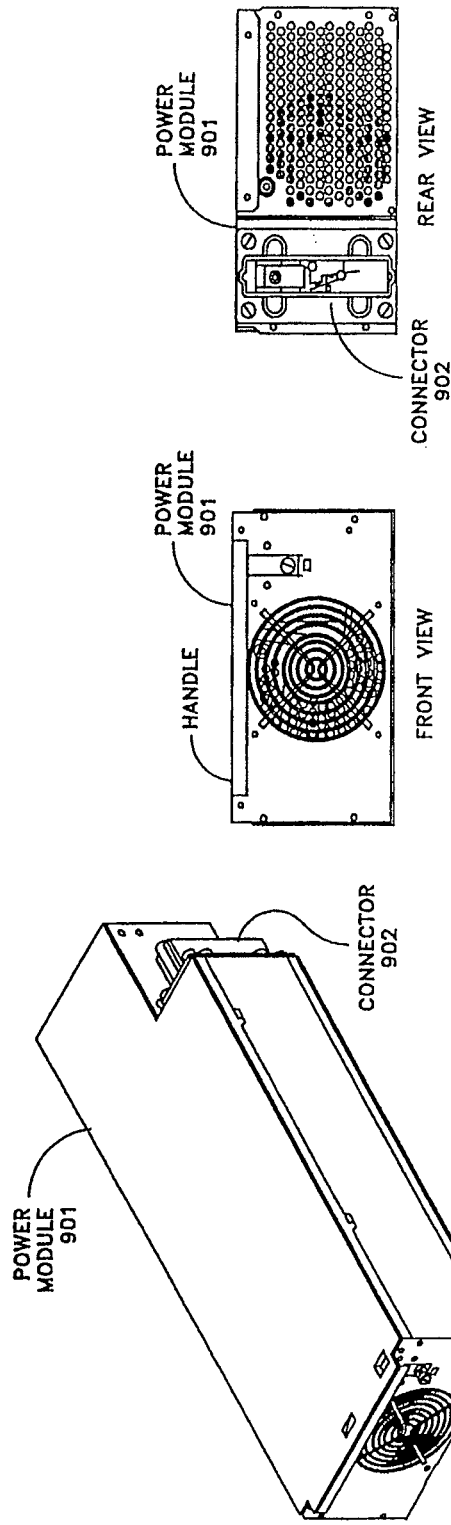

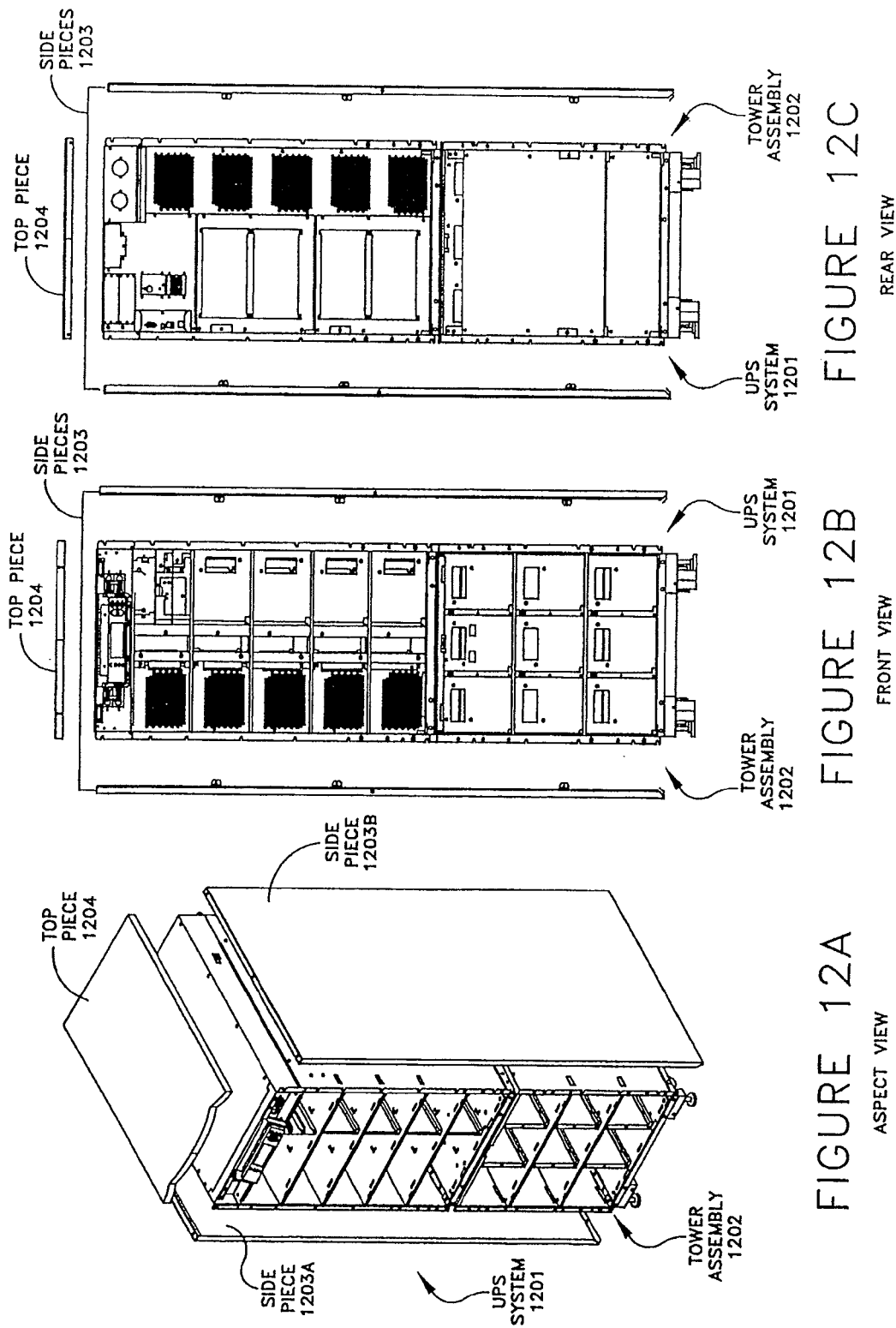

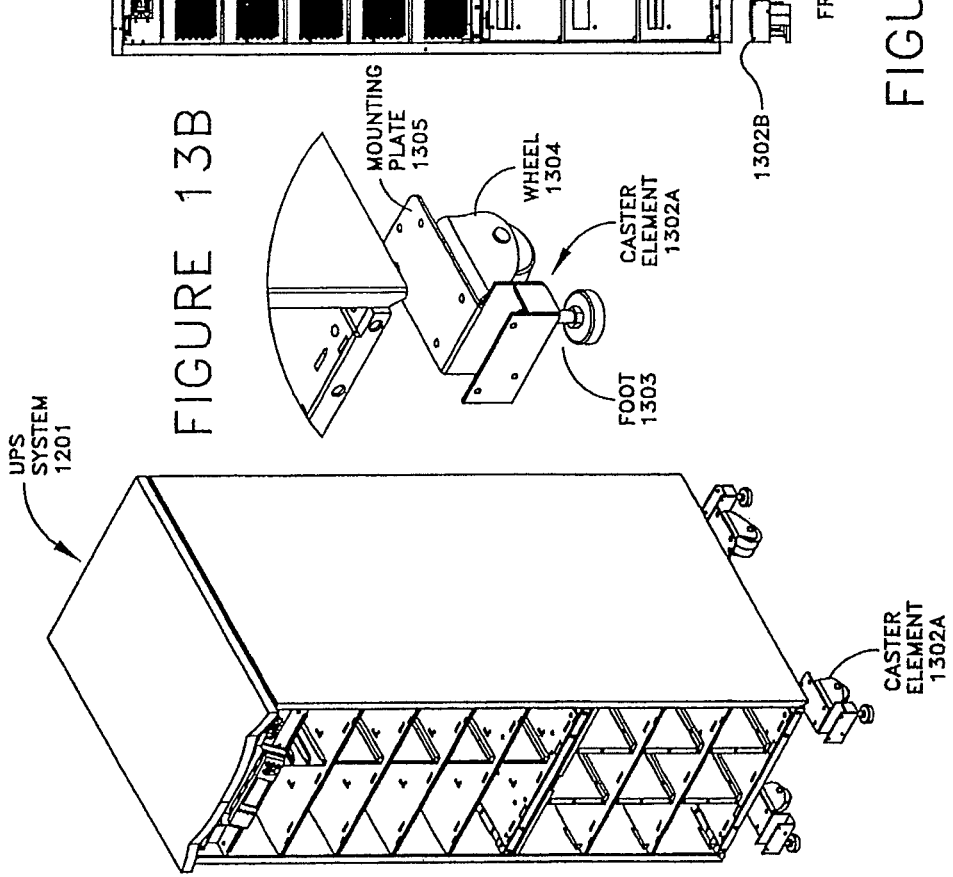

ASPECT VIEW

FRONT VIEW

TOP VIEW

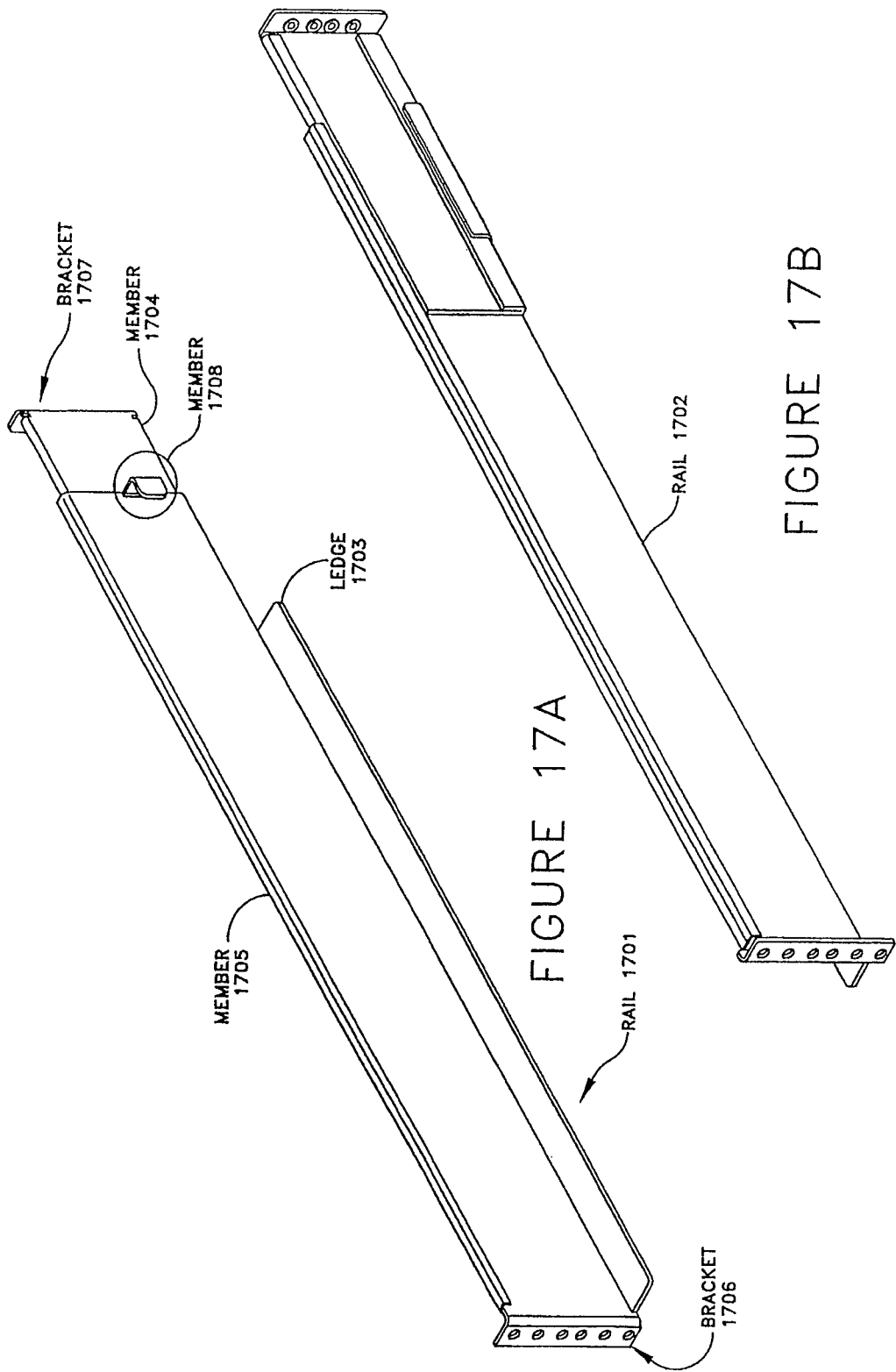

MODULAR UPS

CROSS-REFERENCE TO RELATED APPLICATIONS

This application is continuation of U.S. patent application Ser. No. 12/123,028, filed May 19, 2008 which is a divisional of U.S. patent application Ser. No. 10/763,813, filed Jan. 23, 2004 (now U.S. Pat. No. 7,379,305), all of which are hereby incorporated herein by reference.

FIELD OF THE INVENTION

The present invention relates generally to modular systems, and more particularly, to modular UPS systems.

BACKGROUND OF THE INVENTION

There are numerous types of Uninterruptible Power Supply (UPS) systems that supply backup alternating current (AC) or direct current (DC) power to one or more electrical loads. These UPS systems generally use batteries or types of other energy storage devices that supply such power when a main power supply (e.g., line power) is not available. For example, backup power is provided when power from an AC source performs outside acceptable limits or fails altogether.

These UPS systems generally use multiple energy storage devices configured in parallel or in series to provide backup power. Due to varying power supply requirements of the equipment being powered by the UPS, there is a need to have a UPS system that is modular and can be tailored to meet the power supply requirements to one or more electrical loads. There are several different UPS systems that include modular components such as battery modules and power modules. Battery modules generally provide DC power for conversion by the UPS system to the necessary output power, and power modules accept battery power and perform the appropriate conversion depending on the output requirements.

U.S. Pat. No. 6,310,783 describes one such type of modular UPS chassis that accepts one or more battery modules (or packs) and power modules. In this system, a slot of the chassis can accept either a battery module or power module allowing a more flexible UPS system to be constructed with varying numbers of power modules and battery modules.

There are a number of modular UPS systems that are commercially available. These existing modular UPS systems include replaceable power modules and battery modules provided in a frame, and these systems are each built and tested individually at the factory as a complete system. These UPS systems are generally custom-ordered by a customer and are provided in a variety of configurations. Such modular UPS systems are commercially-available from a variety of vendors including the American Power Conversion Corporation (APC) of West Kingston, R.I.

SUMMARY OF THE INVENTION

Conventional modular UPS systems are limited to being built and configured at the factory, and often involve the use of custom components, thereby increasing their overall cost. One aspect of the invention relates to improving the modularity of UPS systems to reduce system cost and to increase the ease of assembly of such UPS systems. Another aspect of the invention relates to providing a modular UPS system that is capable of being assembled and serviced by field technicians.

According to one aspect of the present invention, a modular UPS system is provided wherein UPS systems may be constructed using a number of different frame components. In one example, a core UPS frame is provided that can accept different combinations of power and battery modules, and an extension frame is provided that can be combined with the core frame to provide a larger UPS system. According to one embodiment, both the core and extension frame types may be used in either a standalone or rack-mounted configuration. Also, core frame types may be provided that allow for varying numbers of power and battery modules to be installed. These core frames may be combined with one or more extension frames (that allow, for example, for varying numbers of battery modules) to create one or more UPS systems that fulfill varying backup power requirements. These frames combination may be used, for instance, as a basis for either a rack-mounted or standalone UPS system.

In conventional modular UPS systems, components are modular in that components may be mixed and installed within a particular frame type. However, such modularity does not extend to multiple frames. According to one aspect of the invention, a number of different core and extension frames are provided, each of which may be combined to form a UPS frame that accepts one or more battery and power modules. Battery modules, for example, may be adapted to work with either the core UPS or extension frames, and therefore, manufacturing costs are reduced, as fewer battery types need to be manufactured, supported, and stocked.

Another aspect of the invention relates to packaging of UPS components such that the UPS frame need not include serviceable items. It is realized that in conventional UPS systems, some of the components used in these systems are permanently associated with the frames, such as a main system frame or expansion frame. If a fault occurs in one of these permanent components, it is necessary to ship the entire frame back to the manufacturer or other service center for repair or replacement. One aspect of the invention relates to packaging components normally associated with a backplane or service module to one or more serviceable modules that can be removed and replaced in the field as necessary.

According to one aspect of the invention, a module is provided that provides an interface between input and output terminal blocks and a UPS system backplane. According to one embodiment of the invention, elements typically located on the system backplane are located on this module, and interconnects are provided to connect these elements to other components of the modular UPS system. In this manner, elements that have a tendency to fail may be placed on a module that is field-serviceable, and therefore, the frame does not need to be repaired or replaced requiring the frame to be shipped to the manufacturer or service center. In one embodiment, a module is provided that includes input signal conditioning and switching components. According to one embodiment of the present invention, the module includes an input circuit breaker, bypass switching element, and a filter circuit. According to another embodiment, the module includes one or more current sensors. One or more such elements are conventionally associated permanently to the UPS system.

Conventional UPS systems are also limited in that modules used with stand-alone systems are generally different than those used for rack-mounted systems. As a result, there is an increased cost associated with designing and producing different module types for both rack-mounted and standalone systems. Another aspect of the invention relates to a modular UPS system having components that may be used in either a standalone system or a rack-mounted system. According to one embodiment, frame components and their associated modules may be designed such that they fit in a rack-mounted enclosure as well as a stand-alone unit. For example, a stand-alone UPS unit may be constructed using one or more exterior skin sections and door components that mount on the frame components to produce the stand-alone UPS system. In one example, door components may be designed that they can be used in multiple frame configurations. Standard frame components used in a rack-mounted configuration may accept casters and leveling feet in a stand-alone configuration. Because one or more components may be used in both configurations, the number of discrete components needed to be produced for the rack-mount and stand-alone versions of the UPS system is reduced, and therefore, manufacturing, ongoing maintenance and supply costs associated with producing and repairing the UPS system are also reduced.

According to one aspect of the invention, it is realized that the design of the structural housing of a battery module frame is generally restricted to the geometry of the batteries that are contained by the housing. Conventionally, battery modules having different geometries (and also different frames) are used for standard power module/battery module frame applications and extension frames that house only battery modules. According to one embodiment of the invention, an improved design of a battery module is provided that optimizes use for both core and extension frames. According to another aspect, a battery module is provided that may be oriented in one of a plurality of orientations, depending on the frame type in which it is installed. Another aspect of the invention relates to connectors, handles, and support/alignment systems associated with the battery module that facilitates multiple orientations.

In one aspect of the invention, it is realized that it may be preferable to provide frame components that can be used as a part of a rack-mounted system. However, it is appreciated that conventional techniques for supporting equipment in a rack are insufficient for mounting components having the size and weight of a frame-based UPS system. More particularly, conventional mounting techniques involve mounting a hardware piece (e.g., a cleat) to both sides of the equipment component to be mounted, and each hardware piece slides into a respective rail mounted to vertical rack mount support members. However, this conventional mounting method is difficult to use with heavier components (e.g., components weighing 40 lbs or more), as it becomes difficult for the installer to adequately align the hardware pieces to their respective tracks due to the heavy weight of the component to be guided onto the tracks. More specifically, installation of the component in the equipment rack becomes difficult due to side-to-side misalignment between the component and the rail system mounted to the rack.

Therefore, an improved method for mounting such components is needed that reduces the difficulty of installation. One such method compensates for additional tolerance and minimizes the weight handling burden on the installer. According to one aspect of the present invention, a support member is provided that supports a frame component from underneath the component, allowing the frame component to be easily slid into a rack. According to another aspect, the support member includes a secondary support that secures the frame component from the rear when the component is fully inserted into the rack. In this manner, the installation is made easier as the installer need not perform a detailed alignment (e.g., a cleat with a track), and the installer need not have access to the rear of the rack to secure the component.

According to one aspect of the present invention, an uninterruptible power supply (UPS) system is provided comprising one or more frame components, of which a first frame component is adapted to hold at least one of a plurality of modules including at least one power module and at least one battery module, the frame component being capable of being installed as a stand alone unit or being installed as part of a rack-mounted system. According to one embodiment of the present invention, the UPS system includes a second frame component, the second frame component being adaptively coupled to the first frame component and being capable of holding one or more modules. According to another embodiment of the present invention, the second frame component is adaptively coupled to the first frame component by at least two support members attached to respective side portions of the first frame component and the second frame component.

According to another embodiment of the present invention, the UPS system further comprises a door component that is removably mounted to a front side of the UPS system. According to another embodiment of the present invention, the UPS system further comprises a door component that includes a plurality of faceplate components, the number of faceplate components depending at least in part on the height of the one or more frame components. According to another embodiment of the present invention, at least one of the plurality of faceplate components may be used in two different doors having different heights. According to another embodiment of the present invention, the door component includes at least one bezel component that may be installed in at least one other door component that has a different height than the door component. According to another embodiment of the present invention, the door component includes a plurality of side pieces that are each formed to suit the height of the UPS system.

According to another embodiment of the present invention, the door component is adapted to accept a plurality of bezel components, wherein the number of the plurality of bezels accepted by the door component depends on the door height. According to another embodiment of the present invention, the door component further comprises a frame, and wherein at least one of the plurality of bezel components is attached removably within the door frame is removable independently of the other of the plurality of bezel components. According to another embodiment of the present invention, the at least one of the plurality of bezel components includes an acrylic plastic.

According to another embodiment of the present invention, the door component is removable from the front of the UPS system. According to another embodiment of the present invention, the door component is removably attached at a bottom edge of the door to a frame of the UPS system. According to another embodiment of the present invention, the door component is removably attached at a top edge of the door to a frame of the UPS system.

According to another embodiment of the present invention, the first frame component, if configured in a stand-alone unit, further comprises a plurality of covers, at least one of which is coupled to an exterior surface of the first frame component. According to another embodiment of the present invention, the UPS system is in a standalone configuration, and wherein the first frame component is capable of accepting at least one or more casters.

According to another embodiment of the present invention, the UPS system further comprises a battery module, the battery module being capable of being installed in the first frame component in a first orientation, and the battery module being capable of being installed in the second frame component in a second orientation. According to another embodiment of the present invention, the first orientation and the second orientation are not the same orientation.

According to another embodiment of the present invention, the first frame component, if installed in a rack-mounted UPS system, includes a support member coupled to the rack and supporting, from underneath the first frame component, the first frame component as it is positioned in the rack. According to another embodiment of the present invention, the support member includes a secondary support member that, when the first frame component is positioned in the rack, prohibits vertical movement of the first frame component. According to another embodiment of the present invention, the secondary support member is adaptively coupled to the first frame component through an opening in the first frame component when the first frame component is fully inserted in the rack. According to another embodiment of the present invention, the secondary support member is adaptively coupled to the first frame component without requiring rear access to the rack. According to another embodiment of the present invention, the support member includes an associated support member positioned in an opposing side of the rack, the associated support supporting from underneath the first frame component, the first frame component as it is positioned in the rack.

According to one aspect of the present invention, a battery module associated with one or more modular uninterruptible power supply (UPS) system units is provided. The UPS system units including at least two different frame types, each of which include a respective at least one frame portion in which the battery module is located, the battery module being capable of being oriented in at least one of a plurality of orientations within the at least one frame portion of the two different frame types, respectively. According to one embodiment of the present invention, the battery module further comprises a connector that is connectable in at least two different orientations. According to another embodiment of the present invention, the connector is an electrical connector. According to another embodiment of the present invention, the electrical connector is adapted to provide backup power to one or more loads associated with the UPS system.

According to another embodiment of the present invention, the battery module further comprises a handle for inserting and removing the battery module, the handle having at least two different orientations. According to another embodiment of the present invention, the battery module further comprising a first alignment element that is coupled to a second alignment element associated with a first frame portion of one of at least two different frame types in which the battery module is inserted when the battery module is in a first orientation with respect to the first frame portion, and wherein the battery module further comprises a third alignment element that is coupled to a fourth alignment element associated with a second frame portion of another of at least two different frame types in which the battery module is inserted when the battery module is in a second orientation with respect to the second frame portion. According to another embodiment of the present invention, the battery module is installed as part of a UPS system comprising a core frame type and an expansion frame type, the expansion frame type being capable of storing additional battery modules, wherein the battery module is capable of being inserted in the expansion frame type in a different orientation than that of a battery module installed in the core frame type. According to another embodiment of the present invention, the battery installed in the core frame type and the battery installed in the expansion frame type is the same type of battery module. According to another embodiment of the present invention, the same battery type is used in the core UPS frame type and the expansion frame type.

According to one aspect of the present invention, a support rail for a rack-mounted system is provided comprising an element that couples the support rail to a front vertical rack mount rail, an element that couples the support rail to a rear vertical rack mount rail, a ledge piece that supports the rack-mounted system from underneath the rack-mounted system, and a rear support member, that, when the rack-mounted system is inserted into the rack, secures the rack-mounted system from moving in a vertical direction. According to one embodiment of the present invention, the rear support member is a c-shaped portion that engages an opening of the rack-mounted system. According to another embodiment of the present invention, the support rail is adapted to be installed on an interior side of the rack, and wherein the ledge piece extends into the interior of the rack. According to another embodiment of the present invention, the support rail includes a first and second rail portions, the first rail portion being insertable within the second rail portion, allowing the support rail to be extended to varying lengths between front and rear vertical mount rails. According to another embodiment of the present invention, the support rail is made at least in part of steel material. According to another embodiment of the present invention, the support rail is installed as part of a support system including another support rail positioned on opposite vertical rails within the rack.

According to another aspect of the present invention, a module is provided for use in a modular uninterruptible power supply (UPS) system, the UPS providing backup power to one or more electrical loads, the module comprising input signal conditioning and switching components. According to one embodiment of the invention, the switching components are bypass switching components used to bypass power module components of the UPS system. According to another embodiment of the present invention, the module further comprises an input circuit breaker that receives an input power supply, the circuit breaker having one or more alternating current (AC) outputs, a filter circuit that is coupled to the one or more outputs of the input circuit breaker, and provides one or more filtered AC outputs, a relay element that receives one or more filtered AC outputs, and provides the one or more filtered AC outputs to a backplane component, and a bypass switching element that receives the filtered AC outputs and is adapted to bypass the relay element to provide electrical signals associated with the filtered AC output directly to the one or more electrical loads.

Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears. All references cited herein are expressly incorporated by reference.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

FIGS. 2A-2C show aspect, front and rear views, respectively, of a core UPS frame according to one embodiment of the present invention;

FIGS. 3A-3C show aspect, front and rear views, respectively, of a UPS extension frame according to one embodiment of the present invention;

FIGS. 4A-4B show an example configuration of a UPS system using modular frames according to one embodiment of the present invention;

FIGS. 5A-5B show front and rear views, respectively, of the example UPS configurations shown in FIGS. 4A-4B, according to one embodiment of the present invention;

FIGS. 7A-7C show aspect, front, and rear views, respectively, of an AC tray module according to one embodiment of the present invention;

FIGS. 8A-8C show aspect, front, and rear views, respectively, of an I/O module according to one embodiment of the present invention;

FIGS. 9A-9C show aspect, front, and rear views, respectively, of a power module according to one embodiment of the present invention;

FIGS. 12A-12C show aspect, front and rear views of an example UPS system configuration according to one embodiment of the present invention;

FIGS. 13A-13D show aspect, caster detail, front and rear views of a caster system according to one embodiment of the present invention;

FIGS. 17A-17B show left and right hand support rails, respectively, that may be used in association with a modular UPS according to one embodiment of the invention;

DETAILED DESCRIPTION

Figure 1:
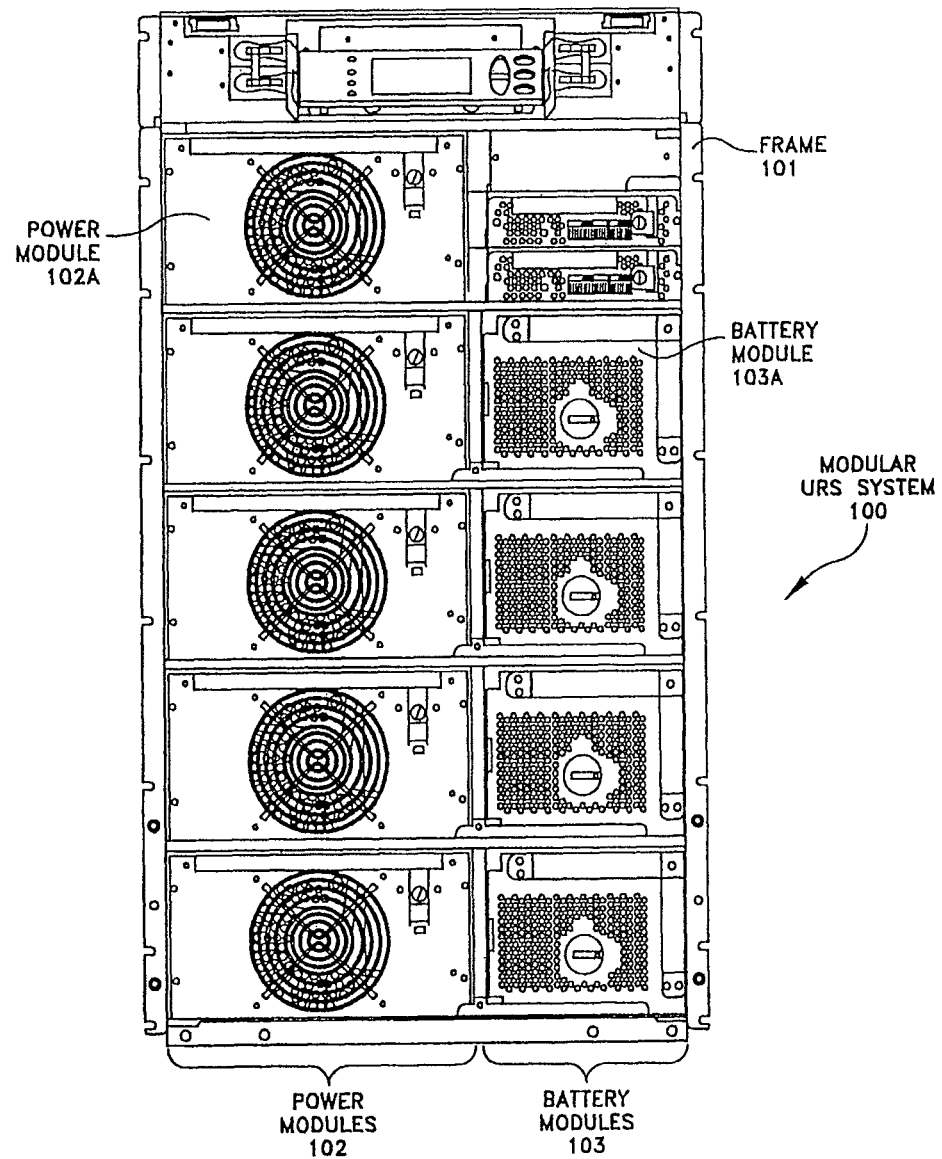
FIG. 1 shows a front view of a modular UPS system according to one embodiment of the present invention.

According to one aspect of the invention, a frame-based modular UPS system is provided that could be used both in a rack-mounted configuration and in a stand-alone configuration. FIG. 1 shows a front view of a modular UPS system according to one embodiment of the present invention. A modular UPS system 100 includes a frame 101 that includes a number of bays that can accept a number of modules associated with the UPS system. For example, one or more bays within the frame may be adapted to house one or more power modules 102 and one or more battery modules 103. As discussed above, the UPS system 100 may be modular in that the system may be equipped with a varying number of power modules and battery modules.

A modular UPS system according to one embodiment of the invention may be provided by the manufacturer with modules (e.g., power modules 102, battery modules 103, etc.) installed, or the UPS frame may be provided separately from the modules for installation and configuration in the field by field technicians. In this manner, costs for manufacturing the UPS system may be reduced.

According to one aspect of the invention, frame 101 of UPS system 100 is sized such that the frame will fit within a standard rack mount configuration. Standard rack-mount systems are well-known in the art and are available from a variety of vendors. Such rack-mount systems are typically used to house server and telecommunication equipment and cabling within the data center, and generally have a set horizontal distance between vertically-oriented rails (e.g., 19 inches) to which equipment is mounted. Generally, such equipment is screwed into drilled openings within each rail of the rack-mount configuration and secured with brackets. Therefore, according to one embodiment of the invention, frame 101 may have an overall dimension that fits within the rail openings within a standard telecommunication rack.

According to one aspect of the invention, modularity of the UPS system is extended to the frame level allowing for the creation of a variety of UPS systems based on frames which can be combined in various combinations to create different versions of a UPS system. According to one aspect of the invention, such frames include core frames which include, for example, system modules for managing the UPS system, one or more power modules, and one or more battery modules. Such core frames may be offered in any number of sizes having different numbers and combinations of bays. In the example shown in FIG. 1, a core frame is shown having five bays for holding five power modules 102, and four bays for holding four battery modules 103.

Although a particular number of power module and battery module bays are shown, the invention is not limited to any particular number, type or combination of bays. Rather, any number and configuration of power module and/or battery module bays may be used.

Modular UPS system 100 may include one or more elements of a UPS system as described in copending U.S. patent application entitled "Methods and Apparatus for Providing Uninterruptible Power" by Frank Masciarelli, et al., filed Jan. 23, 2004, copending U.S. patent application entitled "Method and Apparatus for Monitoring Energy Storage Devices" by Srdan Mutzbdzija, filed Jan. 23, 2004, and copending U.S. patent application entitled "Power Terminal Block" by David Schuttler et al., filed Jan. 23, 2004, each of which applications are incorporated by reference in their entirety.

FIGS. 2A-2C show aspect, front and rear views, respectively, of a core UPS frame according to one embodiment of the present invention. In particular, FIG. 2A shows an aspect view of a core UPS frame 200 according to one embodiment of the present invention. Such a frame may be constructed using sheet metal made of steel (e.g., 1010-1020 CRS) or other material and may be assembled by a variety of techniques include fasteners, welding or interlocking structure members. According to one aspect of the invention, frame 200 is sized to fit within a standard rack-mounted enclosure.

Frame 200 may also include a number of bays that incorporate power and battery modules (e.g., power module bay 201, battery module bay 202).

FIG. 2B shows a front view of frame 200 including a number of bays 203 with the power, battery, and other modules removed. Access to such bays is provided, for example, to a field technician or other person to install one or more power modules and battery modules in the field. According to one aspect of the invention, the UPS frame does not include active components of the UPS system. These active components are generally items that can fail, and therefore must be replaced. Because serviceable items are removed from the frame, the frame need not be shipped back to the manufacturer or other service center for repair or replacement.

FIG. 2C shows a rear view of frame 200 having one or more bays 204, 205 that include additional UPS system components. For example, such bays may house one or more communication modules, I/O connector tray, or other component that may be modularized.

Although FIGS. 2A-2C show a frame 200 having particular number of power module and battery module bays, it should be appreciated that the invention is not limited to any particular quantity or combination of bays, and a core frame may include any number of power module or battery module bays. For instance, another type of core UPS frame may be provided that includes three power modules bays and two battery bays. There may also be an extension frame that extends, for a core UPS frame additional power module bays and battery module bays. For instance, a frame that holds two additional power modules and two additional battery modules may be provided that can be attached physically to the bottom of a core UPS frame 200 as shown discussed above with reference to FIGS. 2A-2C.

According to another aspect of the invention, an extension frame is provided that can be combined with a core frame to provide a larger and more capable UPS system. According to one embodiment, the extension frame is capable of accepting one or more additional battery modules to provide additional backup power capabilities to the UPS system.

FIG. 3A shows an aspect view of a UPS extension frame according to one embodiment of the invention. As shown, frame 300 includes 1 or more module bays 301 that accept additional battery modules for providing backup power to loads attached to a UPS system. The extension frame 300 may be attached to a core UPS frame such as that shown in FIGS. 2A-2C as described above. Frame 300 may also include an opening 302 through which electrical connections are passed. More specifically, opening 302 may be aligned with a corresponding opening (not shown) in a core UPS frame (e.g., frame 200) through which one or more power cables associated with battery outputs of battery modules may be passed through to the core UPS frame. In this manner, electrical connections are fully enclosed within the UPS system, where they may remain free from damage.

FIG. 3B shows a front view of frame 300 having nine bays in which battery modules may be inserted. At the rear of each bay, frame 300 includes an electrical connector which mates to a corresponding connector located at the rear of an inserted battery module. As described further below in conjunction with battery modules according to various embodiments of the invention, the extension frame bays may be oriented in an alternative direction so that more battery modules may be included within the frame, yet still maintaining the extension frame within the confines of a rack-mounted enclosure (e.g., having an inside width between vertical rack rails of 19 inches). Because the same type of battery module may be used in both the core UPS frame and extension frames, the cost of manufacturing, supporting, and supplying battery modules is reduced.

FIG. 3C shows a rear view of frame 300. As shown, frame 300 may include an opening 304 in which a support member may be inserted to prohibit the extension frame from vertical movement within a rack-mounted configuration. Such a support member is discussed in more detail below.

Although FIGS. 3A-3C show a frame 300 having nine bays for storing one or more battery modules, it should be appreciated that other frame configurations that incorporate different number of battery modules may be provided, and the invention is not limited to any particular configuration and number of battery module bays. For instance, an extension frame that holds three battery modules (e.g., one row of frame 300) may be provided that can be combined with a core UPS frame or any other number of extension frames to form an expanded UPS system.

FIGS. 4A-4B show an example configuration of a UPS system using modular frames according to one embodiment of the present invention. In particular, FIG. 4A shows how a to core UPS frame 401 may be combined with extension frame 402 to produce an assembled tower 404. Such a tower may be constructed using one or more attaching members between frames 401 and 402 such as brackets 403. Frames 401 and 402 may be shipped assembled from the factory or installed by a field technician using typical equipment installation methods. For example, brackets 403 may be attached to frames 401, 402 using sheet metal screws or other appropriate attachment methods that can be executed by field personnel.

FIG. 4B shows an assembled tower 404 using core UPS frame 401, extension frame 402, a number of brackets 403 and a number of fasteners (e.g., screws). It is noted that such a tower 404 configuration may be used either as a stand-alone unit or in a rack-mounted configuration.

FIGS. 5A-5B show front and rear views, respectively, of the example UPS configurations shown in FIGS. 4A-4B, according to one embodiment of the present invention. FIG. 5A shows an exploded view of a tower assembly including a core UPS frame 401 attached to an extension frame 402. Frames 401, 402 may be attached by one or more brackets 501A, 501B and may be separated by one or members 502A. For example, number 502A may be a structural support member that attaches to brackets 501A-501B and provides some additional support of core UPS frame 401.

FIG. 5B shows a rear view of tower configuration shown in FIG. 5A. In FIG. 5B, frame 401 may be attached to frame 402 by one or more brackets 501C, 501D and may be separated by one or more members 502B. 502B may be functionally similar to member 502A as discussed above.

Figure 6:
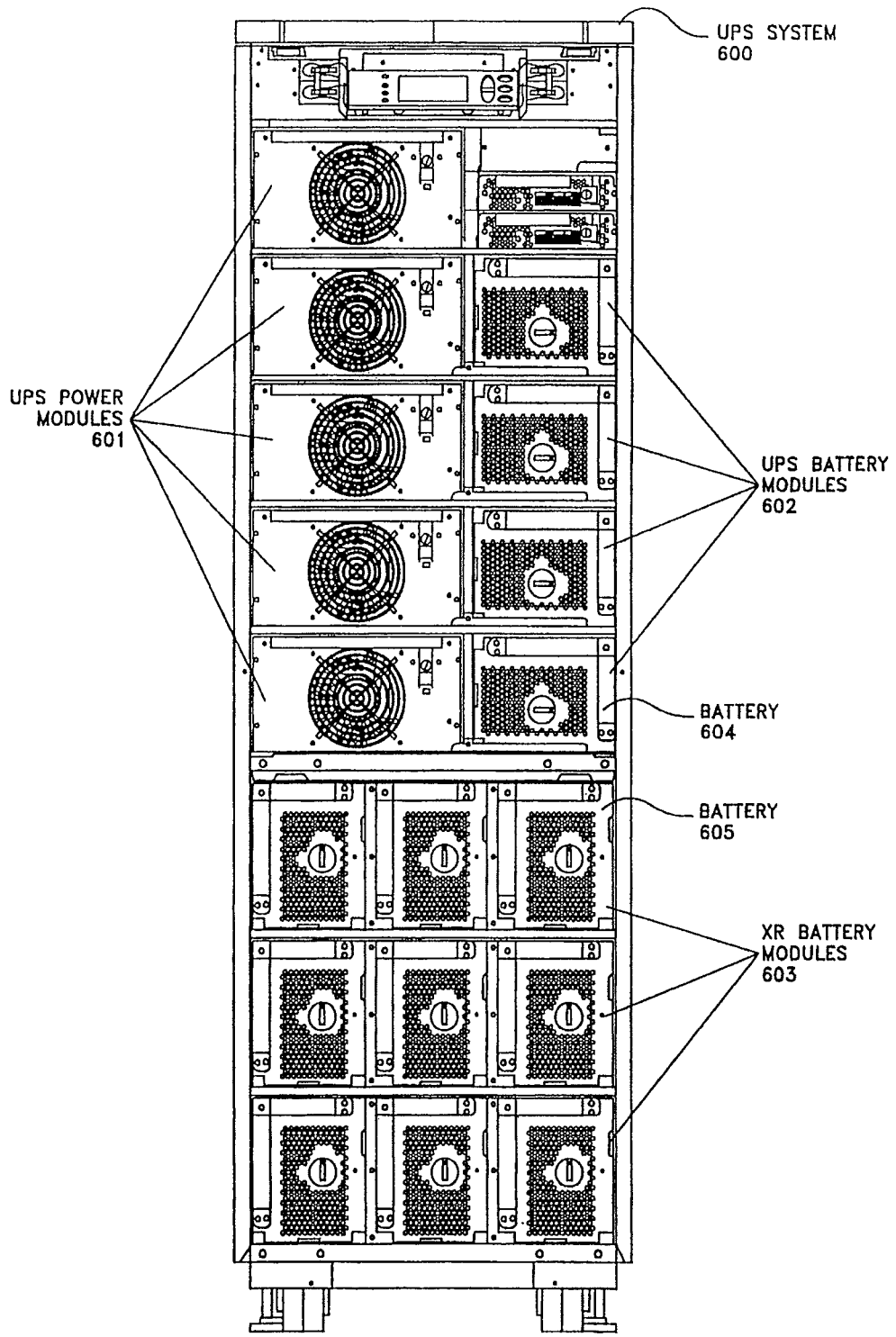
FIG. 6 shows a front view of the example UPS configuration shown in FIGS. 4A-4B, having a number of battery and power modules installed according to one embodiment of the present invention.

FIG. 6 shows a front view of the example UPS configuration shown and described above with reference to FIGS. 4A-4B and FIGS. 5A-5B. In particular, FIG. 6 shows a UPS system 600 having a number of battery and power modules installed within the UPS system 600. More particularly, the UPS system 600 includes a number of UPS power modules 601 inserted into bays of system 600. Further, battery modules are shown as being inserted into the core UPS frame (item 602). Further, within the extension frame are installed a number of XR battery modules 603. According to one embodiment, battery modules installed within the core UPS frame are of the same type that are installed in the extension frame. More particularly, battery 604 inserted in the core UPS frame may be of the same type as a battery 605 installed in the attached extension frame. In the extension frame, however, the battery may be oriented in a different orientation than in core UPS frame, so that a maximum number of batteries may be installed within a standard rack-mount system.

As discussed above, various aspects of the invention relate to packaging of UPS components such that the UPS frame need not include serviceable items. Therefore, components that conventionally are permanently associated with the UPS frame may be modularized so that such components may be removed and replaced in the field as necessary.

As discussed above, serviceable components may be removed from the UPS system onto different modules. One such module is shown with particularity in FIGS. 7A-7C which show aspect, front, and rear views, respectively, of an AC tray module according to one embodiment of the present invention. In particular, AC tray module 700 includes one or more components associated with receiving and handling AC power provided by an incoming line. A more detailed drawing of system components associated with AC tray module 700 are discussed below with reference to FIG. 20. For example, components associated with input filtering of the input AC signal may be included on AC tray module 700. Module 700 may also include an input circuit breaker 704 that isolates the UPS system from overages in input power. Modules 700 may also include an input filter 703 and other devices to perform filtering operations or signal conditioning functions on the input signal. Module 700 may also include one or more elements that perform suppression of transient voltage (e.g., voltage spikes) signals present on the input signal.

Module 700 may also include a bypass switch 705 which allows the UPS system to bypass a power module for providing output power to one or more loads coupled to the UPS system. Such bypasses may be, for example, manual or may be actuated using an electromechanical device such as a relay.

Module 700 interfaces to other UPS system cards via terminal blocks located at the rear of module 700. A rear view of module 700 is shown with more particularity in FIG. 7C. More particularly, module 700 includes one or more terminal blocks that connect to other UPS system components, including, for example, a terminal block which is coupled to an I/O terminal that connects to input power (e.g., line power). Module 700 connects, in turn, to the system back plane of the UPS system via terminal block 702. Such connections include, for example, connections to output loads and connections to individual power modules to provide condition power.

FIG. 7B shows a front view of AC tray module 700 which, in one embodiment, to includes one or more handles 706 to allow for removal and/or insertion of module 700 from the UPS system frame (e.g., a core UPS system frame).

Because such elements are no longer permanently associated with the UPS system frame, these elements are more easily serviced, and are easier and more cost effective to manufacture and test. Although FIGS. 7A-7C show particular components associated with an AC tray module, it should be appreciated that one or more of these components may be located on different modules, and therefore the invention is not limited to any particular module configuration or component location. Rather, aspects of the invention relate to modularizing serviceable components separately from the UPS frame.

FIGS. 8A-8C show aspect, front, and rear views, respectively of an I/O module according to one embodiment of the present invention. In particular, I/O hardware module 801 is provided that allows for a simplified connection by an installer. More particularly, electrical connections to the UPS system (e.g., input power) are created through an I/O hardware module 801 which accepts a number of external cable connections having wires that are attached to terminal blocks located in I/O hardware module 801 which are coupled to a plurality of output pins 803 that transfer the electrical signals to the UPS system. An example of such an I/O hardware module 801 is described with more particularity in pending U.S. patent application entitled "Power Terminal Block" by David Schuttler et al., filed Jan. 23, 2004, herein incorporated by reference in its entirety.

Because the electrical connections of cables are made on a removeable module, an installer may, prior to installation of the module in the UPS system, attach input wires to terminal locks 802, and once attached, the module may be inserted into a rear bay of the UPS system. This modularization allows, for example, an easier access to terminal blocks, as they may be removed by the installer to secure the input wires.

FIG. 8B shows a rear view of I/O hardwire module 801 including one or more openings 804 through which cables may be inserted for attachment of their associated wires to terminal blocks 802. FIG. 8C shows a front view of I/O hardwire module 801 including a plurality of pins for transferring electrical signals received at terminal blocks 802 to the UPS system.

FIGS. 9A-9C show aspect, front, and rear views respectively, of a power module that may be used with the UPS system according to one embodiment of the present invention. More particularly, power module 901 includes circuitry that accepts battery power from battery modules and performs an appropriate output signal generation depending on load requirements of loads attached to the UPS system. For instance, the power module may accept DC power as provided by one or more battery modules and convert the accepted DC power to AC power for powering one or more loads. The power modules and their associated conversions are well-known in the art.

Power module 901 may also include at the rear of the power module 901, a connector 902 that includes electrical connections for receiving input power (e.g., condition power as provided by AC tray module 700) and output connectors that provide the appropriate output signals to one or more loads.

FIG. 9B shows a front view of power module 901 which may include, for example, one or more handles for removing and/or installing module 901 within the UPS frame.

FIG. 9C shows a rear view of the power module 901 and shows more particularly connector 902. Connector 902 may in turn mount to a mating connector located at the rear of a power module bay associated with a core UPS frame (e.g., as discussed above with a reference to FIGS. 2A-2C).

Figures 10A, 10B, 10C:
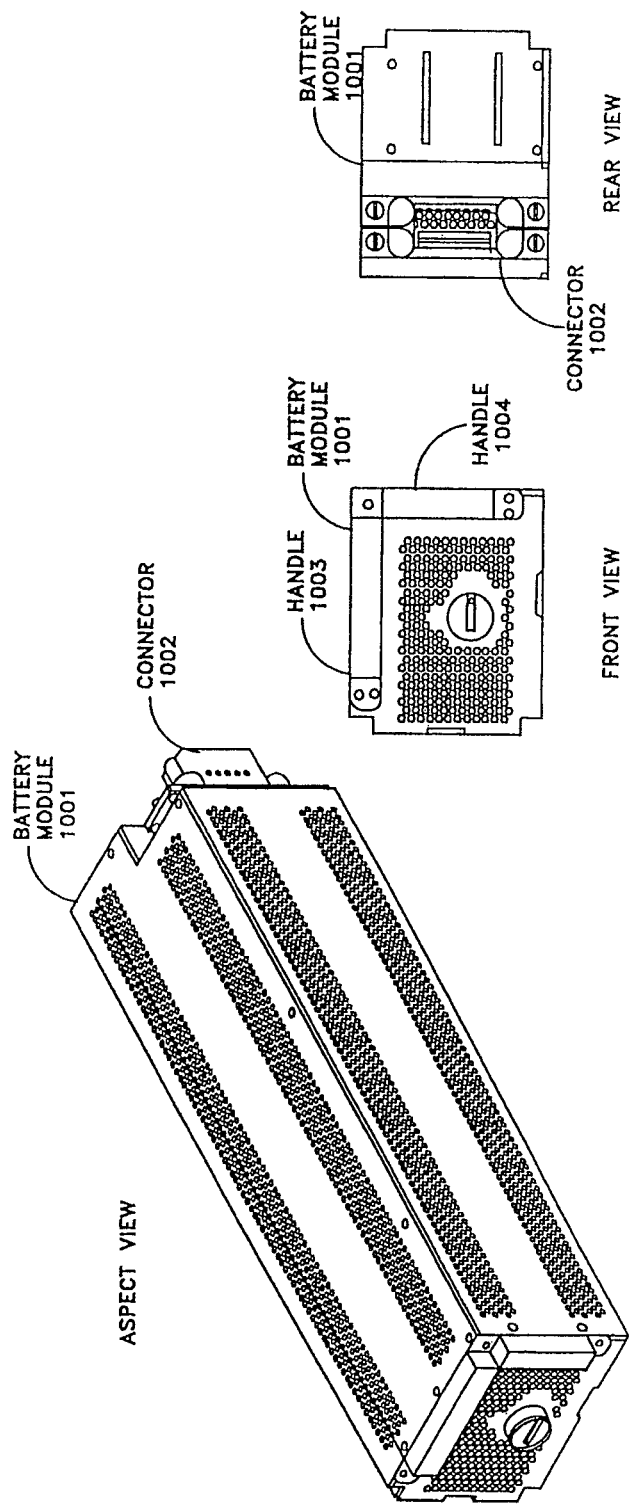
FIGS. 10A-10C show aspect, front, and rear views, respectively, of a battery module according to one embodiment of the present invention.

FIGS. 10A-10C show aspect, front, and rear views, respectively, of a battery module according to one embodiment of the present invention. In particular, FIG. 10A shows a battery module 1001 that may be inserted into a battery module bay associated with a core UPS frame or extension frame (e.g., as discussed above with reference to FIGS. 2A-2C and 3A-3C). Battery module 1001 includes a connector 1002 which electrically connects batteries within battery module 1001 to one or more power module associated with the UPS system. Connector 1002 may also provide monitoring capabilities for the UPS system for monitoring operating condition of battery module 1001.

FIG. 10B shows a front view of module 1001 including one or more handles 1003, 1004 for inserting/removing module 1001 from a battery module bay of a core UPS frame or extension frame. According to one aspect of the present invention, battery module 1001 may be capable of being installed in two different orientations within a frame. For example, module 1001 may be installed in a horizontal position as shown in FIG. 10B, and is shown more particularly in FIG. 6 with respect to UPS battery module 602. When removing such batteries, a handle 1003 is used for lifting the battery module over a ridged edge of the core UPS battery module bay. Similarly, if a battery module 1001 is installed in a vertical orientation as shown above with reference to FIG. 6 in XR battery module 603, battery module 1001 may be removed using handle 1004 by lifting on the handle 1004 to vertically move the battery beyond a leading ridge that secures the battery module and the extension frame.

FIG. 10C shows a rear view of battery module 1001 which includes a more detailed view of connector 1002. According to one embodiment of the invention, the connector is connectable to a mating connector located at the rear of a battery module frame bay when the battery module is located in either of a number of different orientations. As discussed above with reference to FIG. 6, battery modules may be oriented in either a vertical or horizontal configuration and therefore connectors located at the rear of these battery module bays may also be oriented either in the horizontal or vertical direction to mate with battery connector 1002. Alternatively, a connector may be provided with a battery module that is capable of mating with a corresponding mating connector in more than one orientation. It should be appreciated however that the invention is not limited to the connector of the frame being oriented in a different direction, or the battery module connector being capable of connecting to a corresponding mating connector in multiple orientations.

Figure 11:
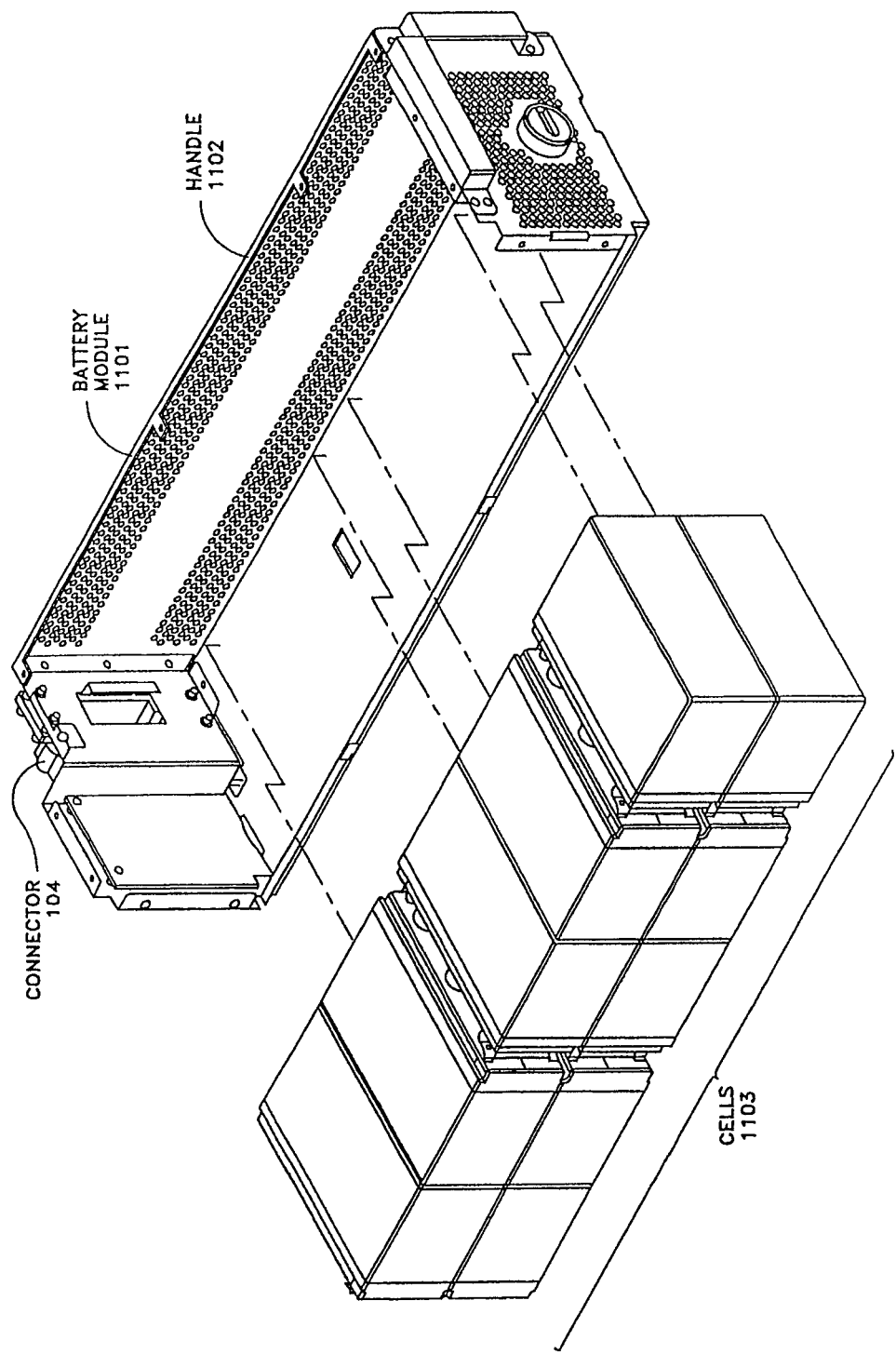
FIG. 11 shows an exposed view of a battery module according to one embodiment of the present invention.

FIG. 11 shows an exposed view of a battery module 1101 according to one embodiment of the present invention. In particular, battery module 1101 includes a housing 1102 that may be, for example, manufactured of a metal enclosure. This enclosure contains and supports one or more individual batteries 1103 that are electrically connected to the UPS system via connector 1104. Batteries 1103 may, for example, include ten (10) 12-volt batteries arranged in series to provide a 120 volt DC power source. Therefore, battery module 1101 may include electrical connections (not shown) between the individual batteries that provide such a series configuration.

As discussed above, a modular UPS is provided that could be used both in a rack-mounted configuration and in a standalone configuration. FIGS. 12A-12C show aspect, front and rear views of an example stand-alone UPS system configuration according to one embodiment of the present invention. In particular, UPS system 1201 may be provided that includes one or more frames, (e.g., core UPS and/or extension frames) that can be used for the basis of a UPS system. As shown in FIG. 12A, a tower assembly 1202 including a core UPS and extension frame, a stand-alone UPS system may be construction.

On system 1201 may be installed a plurality of cover pieces 1203, 1204 that are coupled to the one or more frames and improve the aesthetic quality of the UPS system 1201. Such pieces 1203, 1204 may be capable of being installed, for example, by technicians in the field.

Side pieces 1203A-1203B may be installed on alternate sides of the tower assembly 1202. For instance, side pieces 1203A-1203B may be, for example, made of a plastic material, finished sheet metal, or other material typically used for encasing components. Pieces 1203A-1203B may attached to tower assembly 1202 using a number of fasteners such as screws, plugs or the like, that are capable of being installed by field technicians. Side pieces 1203A-1203B may come in a variety of sizes to suit the variety of frame sizes that may be created using core UPS frames and extension frames. A top piece 1204 may be used to cover the tower assembly 1202 and may be made of similar material as side pieces 1203A-1203B.

FIGS. 12B and 12C show front and rear views, respectively, of the tower assembly 1202 with side pieces 1203 and top piece 1204. As can be seen in FIGS. 12B and 12C, side pieces 1203 may be attached to the frame by one or more fasteners such as screws that are attached to frames of the tower assembly 1202. It should be appreciated that covers attached to tower assembly 1202 may be any type of material attached in any manner to improve the aesthetic quality of the stand-alone unit, and the invention is not limited to any particular type of cover material or attachment method.

Further, the stand-alone unit may be equipped with one or more caster elements 1302 that allow the stand-alone unit to be moved or alternatively, remain in a stationary position. FIGS. 13A-13D show aspect, caster detail, front and rear views of a caster system that may be used with a UPS system according to one embodiment of the present invention. As shown in FIG. 13A, a caster element 1302A may be attached to the bottom of a frame component associated with a UPS system 1201. Element 1302A may be attached, for example, using one or more fasteners (e.g., screws) that secure the caster element 1302A to the frame. Caster elements 1302A may be, for example, secured to either a core UPS frame or an extension frame, depending on the configuration.

FIG. 13B shows more detail of a caster element 1302A according to one embodiment of the invention. Caster element 1302A includes a mounting plate 1205 which is attached to a frame component associated with a UPS system 1201. Caster element 1302A also include a wheel 1304 that allows the UPS system to be moved to its destination. Element 1302A also includes a foot 1303 which, when lowered, allows the UPS system unit 1201 to be leveled and secured in place.

FIGS. 13C and 13D show front and rear views, respectively, of UPS system 1201 which includes four caster elements (items 1302A-1302D) attached near each corner of the UPS frame.

Figures 14A, 14B:
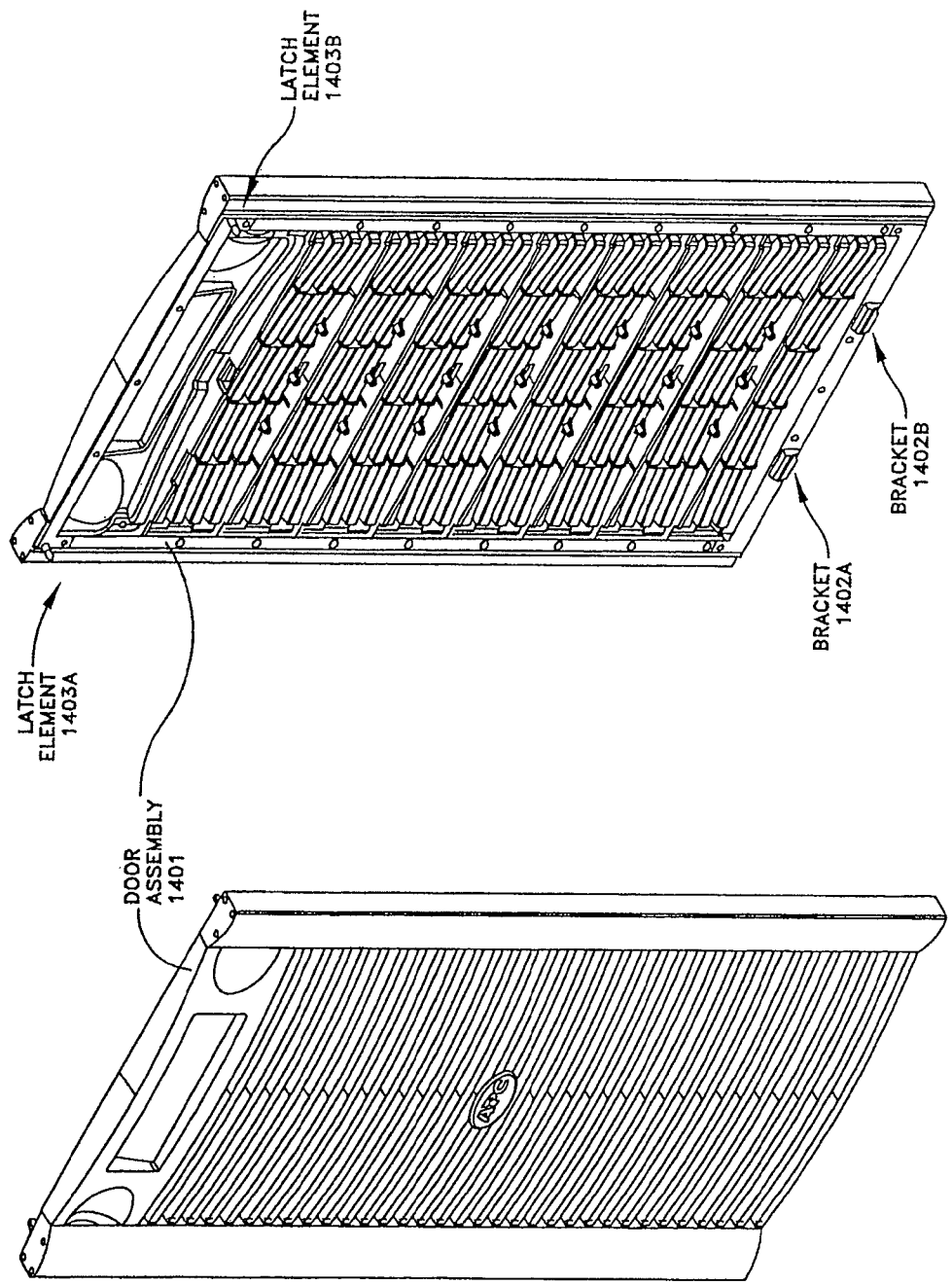
FIGS. 14A-14B show aspect views of a UPS door assembly according to one embodiment of the present invention.

As discussed above, a stand-alone UPS system (e.g., UPS system 1201) may be used in a stand-alone configuration. To further improve the aesthetic appearance of the UPS system, to reduce noise generated by UPS components, and to assist in distributing air flow, a door assembly 1401 may be provided that covers certain internal details of the UPS system. FIGS. 14A-14B show aspect views of a UPS door assembly according to one embodiment of the present invention. More particularly, door assembly 1401 may be attached to the front of a UPS system 1201 to cover up days associated with one or more of the modules. More particularly, door assembly 1401 may include elements that hide one or more power and/or battery modules installed in UPS system 1201.

Door assembly 1401 may attach to the UPS system 1201 at the bottom edge of a frame of the UPS system and near a top edge of the UPS system frame. More particularly, door assembly may include one or more brackets (e.g., brackets 1402A-1402B) that attach to openings created near a bottom edge of the UPS system frame (e.g., a core UPS frame or extension frame). Brackets 1402A-1402B may be hinged such that door assembly 1401 may be pulled away from the top of the UPS system cabinet and the door assembly may be removed from the openings at the front bottom edge of the UPS system cabinet. Door assembly 1401 may also attach to the UPS system frame by one or more fasteners. For example, these fasteners may be removable and allow the door assembly 1401 to be freely removed from the UPS system cabinet. In one embodiment, door assembly 1401 includes a plurality of latch elements 1403A-1403B which insert into respective mating elements within UPS system 1201. These fasteners may be, for example, traditional roller type latches or any other removable fastener.

Figure 15:
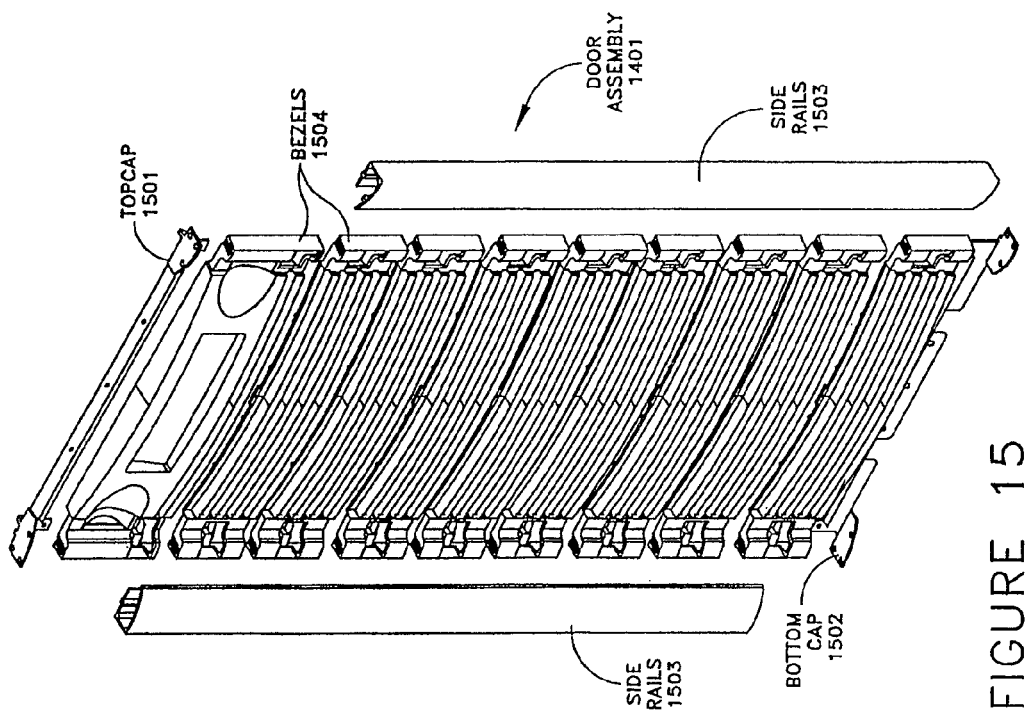
FIG. 15 shows an exploded view of a UPS door assembly according to one embodiment of the present invention.

FIG. 15 shows an exploded view of a UPS door assembly (e.g., door assembly 1401) according to one embodiment of the present invention. More particularly, door assembly 1401 includes a plurality of covers that cover details within the UPS system frame. These covers may be, for instance, one or more bezels 1504 that can be selected according to the modules in associated bays being covered. For instance, there may be different sizes of bezels that cover different size bays (e.g., 1U, 2U, 3U, etc.) Such bezels 1504 may be chosen selectively by a technician assembling a door in the field, or at a local installation center.

Assembly 1401 includes one or more side rails 1503 which hold the bezels into place. Assembly 1041 may include a top cap 1501 and a bottom cap 1502 which keep the bezels 1504 from sliding out of the assembly. In one embodiment of the invention, components of door assembly 1401 may be selected and used for doors having different sizes that cover a variety of core and extension UPS frames. Side rail 1503 may be sized according to the height of the UPS unit with which the door assembly 1401 is installed.

Top cap 1501 and bottom cap 1502 may be made of sheet metal material and attached to side rails 1503 using screws or any other method of attachment. For instance, top and bottom brackets may be fabricated using galvanized, pre-plate 1010-1020 CRS. Side rails 1503 may be manufactured using extruded aluminum. Bezels 1504 may be manufactured using plastic material which is injection-molded. Other material types and attachment methods may be used, and the invention is not limited to any particular types of materials or fastening methods.

As discussed above, one or more bezels 1504 may be inserted into door assembly 1401. These bezel components may be, for example, slid into side rails 1503, or inserted and/or removed using attachment elements associated with a bezel component. For instance, the bezel component may include a latch that engages a portion of the door assembly 1401, which, when pressure is applied, disengages from the door assembly 1401. Such attachment may include a latch or any other attachment method.

Figure 16A:
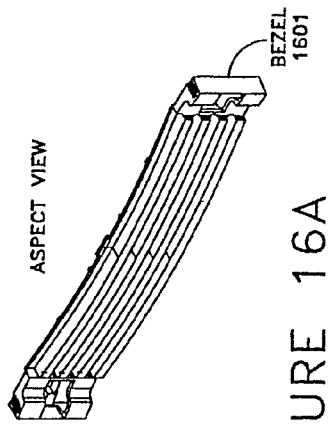
FIGS. 16A-16C show aspect, rear, and top views of a bezel that may be used in a UPS door assembly according to one embodiment of the present invention.
Figure 16B:
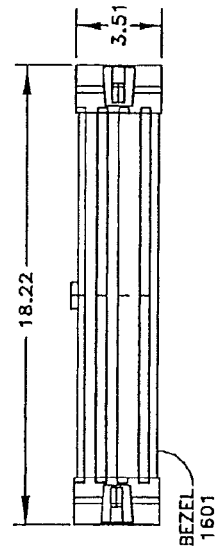
Figure 16C:
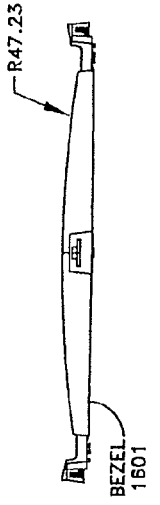

FIG. 16A-16C show aspect, rear, and top views of a bezel that may be used in a UPS door assembly according to one embodiment of the present invention. More particularly, FIG. 16A shows a bezel component 1601 that may be used in association with a door assembly 1401.

FIG. 16B shows a front view of a bezel 1601 according to one embodiment of the invention. As shown, bezel 1601 is approximately 18.22 inches wide and 3.51 inches high, and this bezel corresponds to a 2U sized bezel. As discussed above, bezels may be provided in any number of sizes to cover bay/components having various sizes.

FIG. 16C shows a top view of bezel 1601 having a slight curvature of the outside edge of the bezel. The bezel dimensions (e.g., bezel depth) may be chosen such that they fit within a rack-mounted enclosure. That is, when a door of the rack-mounted enclosure is closed, the bezel elements and other elements associated with the door component do not interfere, and therefore the door assembly may be used in both rack mounted and stand-alone configurations.

In this manner, the cost for producing doors for a variety of UPS units are reduced, as standard components may be used to assemble doors of various sizes that can be used with different UPS system configurations. It is noted that this door assembly may be used, for example, for either a stand alone unit or within a rack mounted configuration. Because the door may be assembled and fixed by a field personnel, costs for creating and supporting such hardware are reduced.

As discussed above, according to one aspect of the invention, a modular UPS is provided that may be installed within a rack-mounted configuration. As discussed above, it is noted that conventional rack mounting methods for heavier components are difficult to use by an installer, as an installer typically needs to align a mounted hardware piece (e.g., a cleat) to a respective rail mounted to vertical rack mount support members. Because it becomes difficult for the installer to manipulate the heavy component to align the hardware piece, alignment becomes difficult.

According to one aspect of the invention, a rail mounting system is provided that reduces the level of difficulty for installing heavier rack-mounted components. FIG. 17A-17B show left and right hand support rails, respectively, that may be used in association with a modular UPS according to one embodiment of the invention. In particular, FIG. 17A shows a left hand rail 1701 including a support member which supports a component from underneath. Such a support member may include, for example, a ledge 1703. However, it should be appreciated that other support members may be used (e.g., a support member extending between a left hand rail 1701 and a right hand 1702).

Rail 1701 may include a primary member 1705 which encases a secondary support member 1704 inserted within member 1705. Portions of rail 1701 may be fabricated using, for example, galvanized pre-plate steel (e.g., 1010-1020 CRS). However, other materials may be used, and the invention is not limited to any particular materials or manufacturing method.

Rail 1701 may include one or more brackets 1706, 1707 for securing rail 1701 to vertical frame members of a rack-mounted system. Such bracket 1706, 1707 may be formed as part of rail 1701, and may include one or more openings for receiving one or more fasteners (e.g., rack-mount screws). In one example, bracket 1706 is attached to a front, left hand side rail associated with a rack-mounted unit, and bracket 1707 is attached to a left-hand rear vertical rail of the rack-mounted system. Rail 1701 may be installed, for example, by a field technician within the rack-mounted system prior to insertion of the component. FIG. 17B shows a right-hand rail 1702 that may be installed on vertical rails opposite those on which rail 1701 is installed.

Figure 18B:
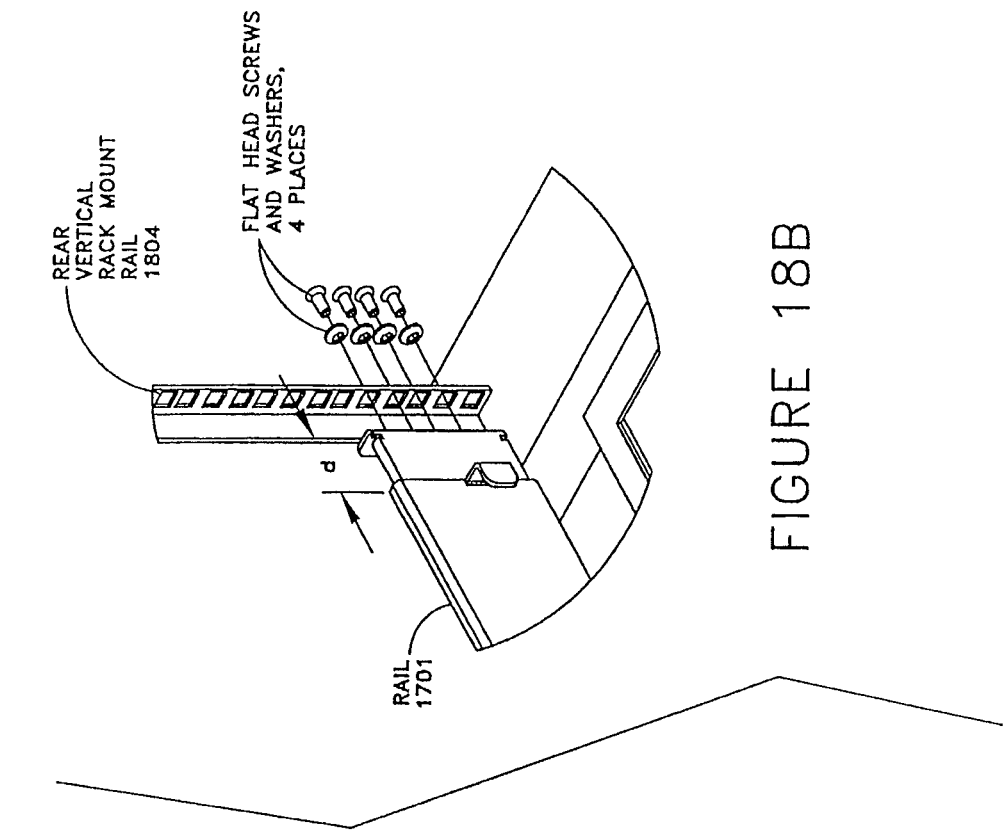
FIGS. 18A-18B show installation of a rail into a rack assembly according to one embodiment of the present invention.
Figure 18A:
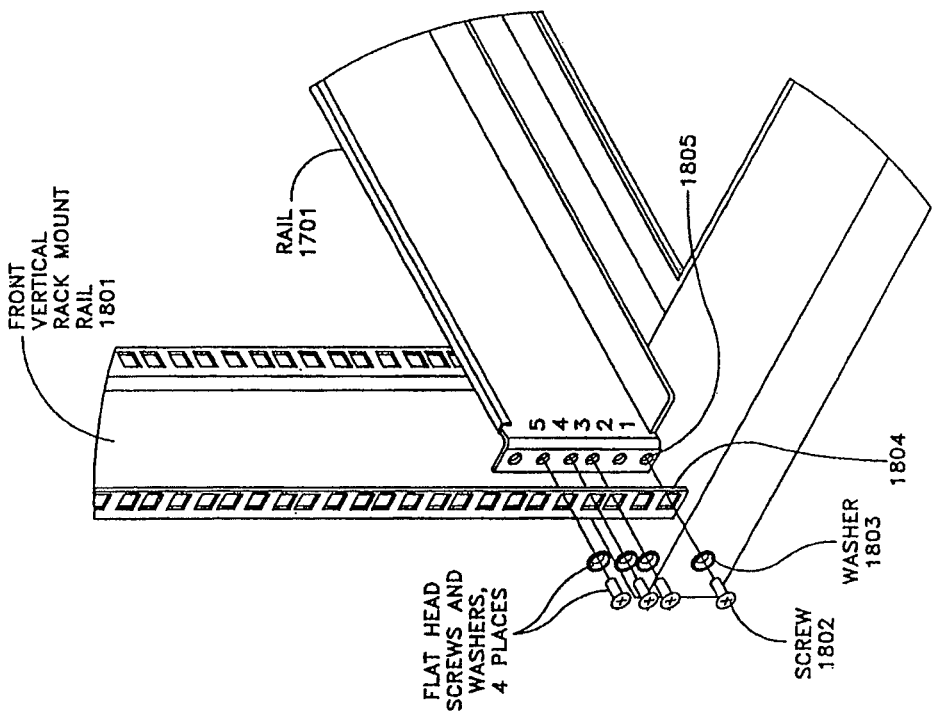
Figure 19:
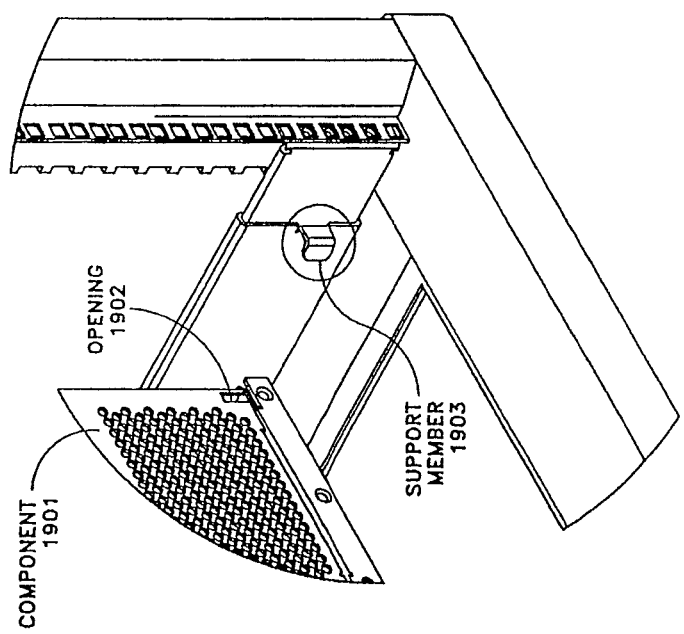
FIG. 19 shows an installed rail according to one embodiment of the present invention.

FIGS. 18A-18B show installation of a rail (e.g., rail 1701) into a rack assembly according to one embodiment of the present invention. FIG. 18A shows a front left side of a rack assembly having a vertical rack mount rail 1801. Rail 1801 includes a number of openings through which fasteners may be installed. More particularly, rail 1701 may be aligned behind an edge of rail 1801 having a number of openings which can be aligned to one or more openings of rail 1701. One or more fasteners (e.g., screws) may be inserted through openings in rail 1801 and inserted into a bracket associated with rail 1701. For instance, screw 1802 may be inserted into an opening 1804 in vertical rack mount rail 1801 and inserted into an opening 1805 of rail 1701. One or more washers, (e.g., washer 1803) may be used and associated with one or more screws to secure rail 1701 to the vertical rack mount rail 1801.

Rail 1701 may also be secured at the rear of the rack mount assembly. More particularly, as shown in FIG. 18B, rail 1701 may be secured to a rear vertical rack mount rail 1804 by one or more fasteners. As discussed above, with reference to FIG. 18A, one or more screws may be positioned through openings in rail 1804 and further into openings within a bracket associated with rail 1701. It is noted that rail 1701 may be extended by adjusting an interior support member an additional distance d to extend to vertical rack mount rail 1804. Such an extending rail 1701 is beneficial, in that the size of rail 1701 may be adjusted to account for discrepancies in the distance between front and rear vertical rack mount rails (e.g., rails 1801, 1804). Because rail 1701 can be extended in this manner, rail 1701 may be used in a variety of installations, and therefore, production costs are further reduced.

Figure 20:
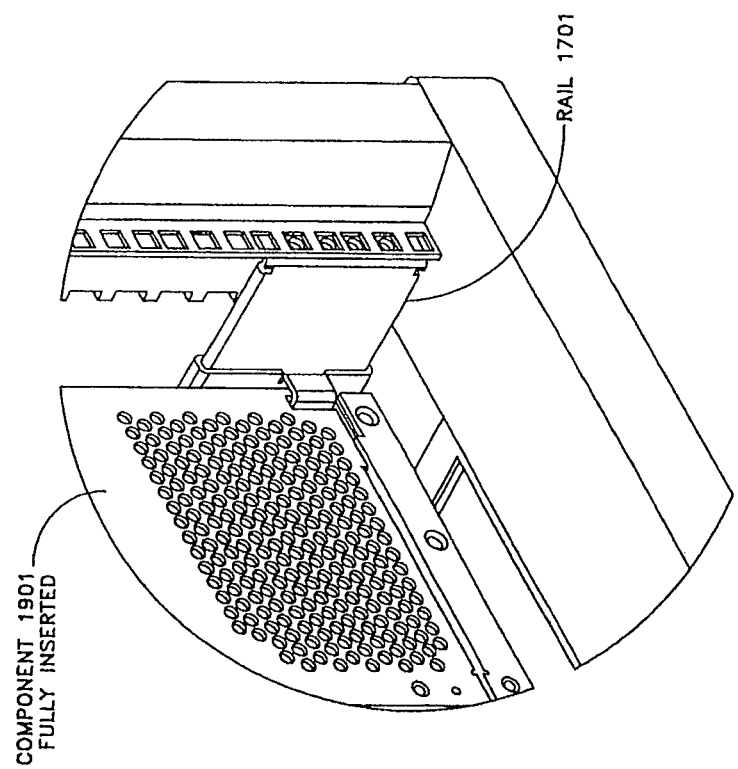
FIG. 20 shows an installed rail according to one embodiment of the present invention.

Once both left and right hand rails are installed within the rack mount system, a component 1901 may be inserted into the rack. Component 1901 may include an opening 1902 that aligns with a support member 1903 when component 1901 is fully inserted into the rack. FIG. 20 shows component 1901 fully inserted into the rack, and support member 1903 inserted into opening 1902 of component 1901. In this manner, vertical movement of component 1901 is restricted as rail 1701 prohibits vertical movement of component 1901 with an additional support member that inserts into the frame of the component (e.g., a core UPS frame or expansion frame associated with a modular UPS system).

Such a rail system increases the allowable tolerance zone for blind engagement between the component being supported and right and left side vertical rail assemblies mounted in an equipment rack. Because according to one embodiment of the invention, this rail system includes a sliding assembly, the length of the rail may be varied to allow for depth differences between different types of equipment racks.

The front piece of the rail carries weight of the component being installed. According to one embodiment, the rail includes an L-shaped section on both the right and left hand rails which creates a shelf when mounted in the equipment rack. The component is placed on the shelf and then pushed back into the equipment rack until front brackets of the component are positioned against vertical rack mount rails. When the component is fully inserted, openings in the frame except a tab feature located on the rear end of the rails, with this tab acting as a rear anchor between the component being installed and the rail system. In comparison with conventional C-section and the cleat design as described above, side-to-side alignment of the component becomes less critical, and therefore the installation becomes simpler for an installer in the field.

As discussed above, components which are conventionally associated with a UPS frame may be moved to one or more modular components which can be inserted/removed for installation in the field by field personnel and removed/replaced in case of a component fault. Also as discussed, input power conditioning and switching components may be moved from a backplane or system processor associated with the UPS frame, to a specialized module or tray referred to herein as an AC tray. FIGS. 7A-7C discussed above show aspect, front, and rear views, respectively, of a physical layout of an AC tray module 700 according to one embodiment of the present invention.

Figure 21:
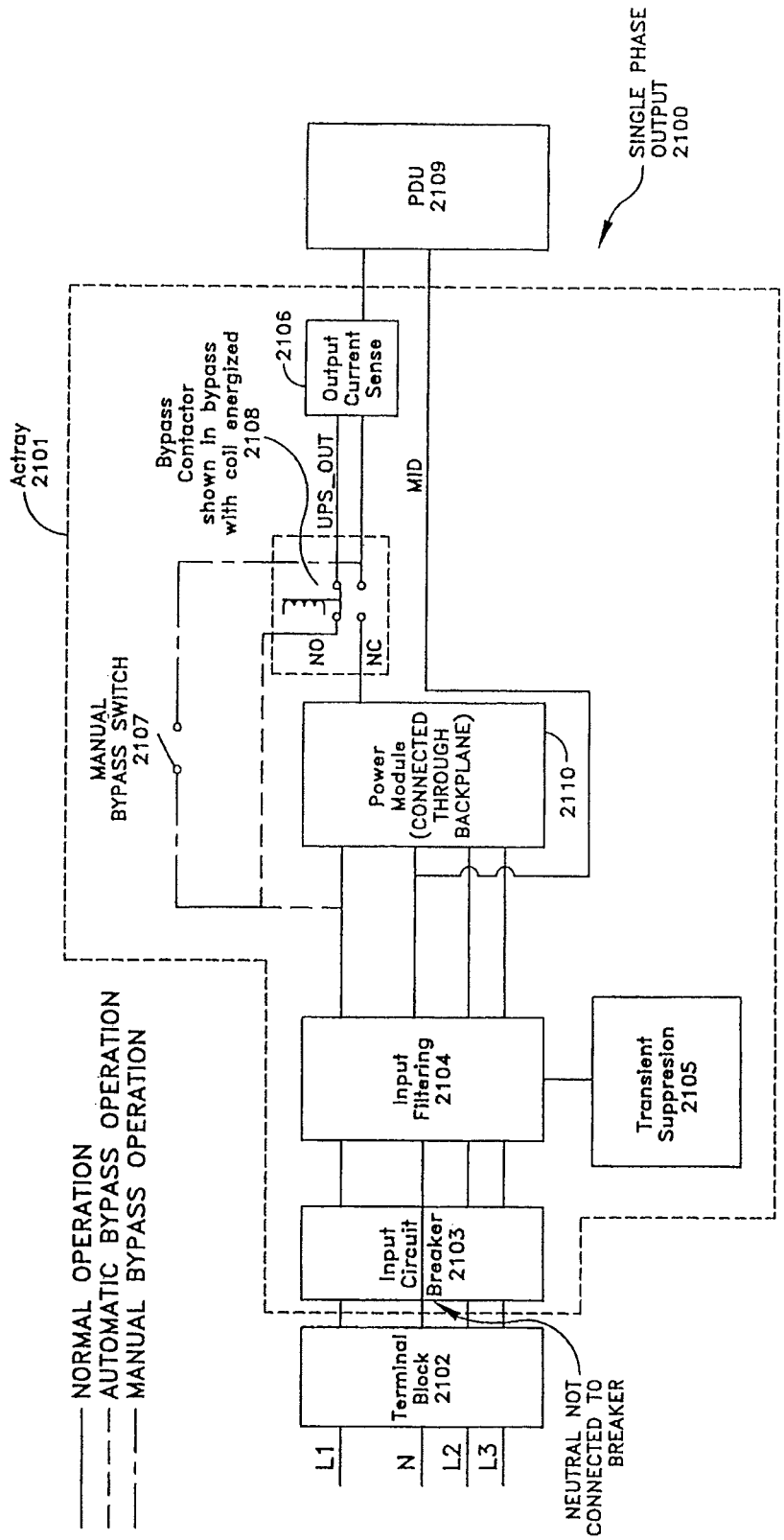
FIG. 21 shows a circuit diagram of an AC tray circuit according to one embodiment of the present invention.

FIG. 21 shows a shows a circuit diagram of an AC tray circuit according to one embodiment of the present invention. FIG. 21 shows a particular configuration where the UPS produces a single phase output. According to one embodiment of the invention, the AC tray module 2101 is a modular part of the UPS system that provides an interface between the Input/Output terminal block and the UPS system backplane. In particular, tray 2101 includes an input circuit breaker 2103 that receives an input power supply through a terminal block 2102 having one or more lines (L1, L2, L3, N).

The circuit breaker 2103 includes one or more alternating current (AC) outputs. Tray 2101 also includes an input filtering circuit 2104 that is coupled to the one or more outputs of the input circuit breaker 2103, and provides one or more filtered AC outputs to a power module or a load attached to the UPS system. A relay element (not shown) also receives one or more of the filtered AC outputs, and provides one or more filtered AC outputs to a backplane component that is coupled to power module 2110.

Tray 2101 further includes a bypass switching element (e.g., bypass contactor 2108) that receives the filtered AC outputs and is adapted to bypass the relay element that provides power to one or more power modules, and instead provides electrical signals associated with the filtered AC output directly to the one or more electrical loads (PDU 2109). Tray 2101 may also include a manual bypass switch that may be activated by an operator from the UPS system. In one embodiment, the AC tray 2101 includes a physical switch that can be manually triggered by the operator.

Tray 2101 may also include an output current sensor 2106 which is used to monitor current as provided by the power modules, or any of the bypass modes. As discussed, tray 2101 may also include one or more transient suppression elements used for suppressing transient electrical signals received from the input terminals.

Figure 22:
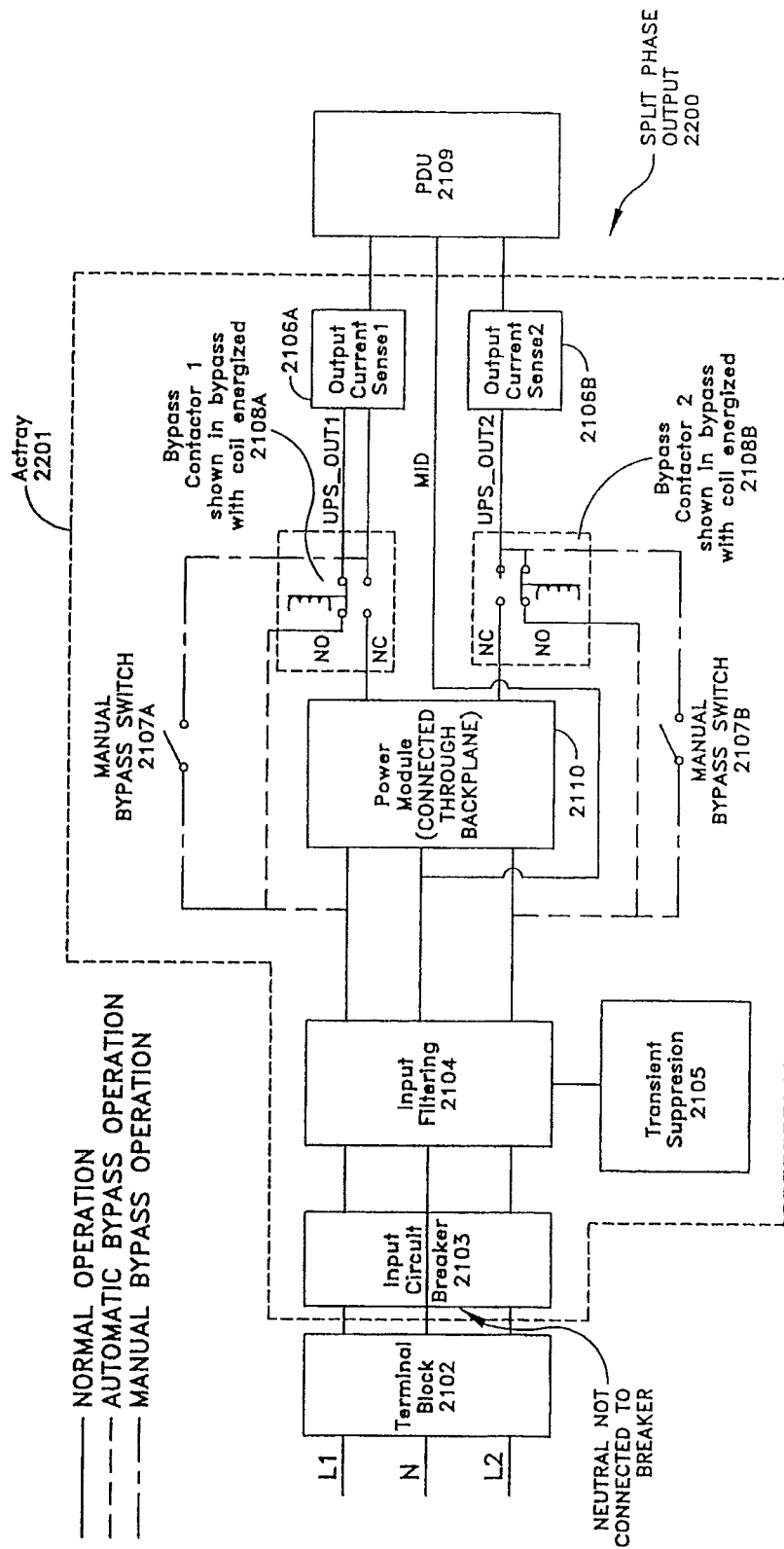
FIG. 22 shows a circuit diagram of an AC tray circuit according to another embodiment of the present invention.

FIG. 22 shows another AC tray circuit according to another embodiment of the present invention. In particular, tray 2201 includes similar components to that of tray 2101, but includes additional components such that the UPS system may operate in a split phase output configuration. To this end, tray 2201 additionally includes another manual bypass switch (manual input bypass switch 2107B) in addition to manual bypass switch 2107A. Further, tray 2201 includes an additional bypass contactor 2108B and output current sensor 2106B to support the split phase. In this manner, components that have a potential to fail may be modularized. Therefore, when a fault is experienced in any of these components, the AC tray module may be repaired or replaced without having to ship or otherwise remove the entire UPS system.

Having now described some illustrative embodiments of the invention, it should be apparent to those skilled in the art that the foregoing is merely illustrative and not limiting, having been presented by way of example only. Numerous modifications and other illustrative embodiments are within the scope of one of ordinary skill in the art and are contemplated as falling within the scope of the invention. In particular, although many of the examples presented herein involve specific combinations of method acts or system elements, it should be understood that those acts and those elements may be combined in other ways to accomplish the same objectives. Acts, elements and features discussed only in connection with one embodiment are not intended to be excluded from a similar role in other embodiments. Further, for the one or more means-plus-function limitations recited in the following claims, the means are not intended to be limited to the means disclosed herein for performing the recited function, but are intended to cover in scope any means, known now or later developed, for performing the recited function.

As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, shall be closed or semi-closed transitional phrases, as set forth, with respect to claims, in the United States Patent Office Manual of Patent Examining Procedures (Original Eighth Edition, August 2001), Section 2111.03.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

What is claimed is:

1. An uninterruptible power supply system comprising:
a first frame component adapted to hold a plurality of modules including at least one power module and at least one battery module; and
a second frame component adapted to hold a plurality of modules including at least one battery module, wherein the second frame component is removably coupled to the first frame; and
wherein each of the first frame component and the second frame component is contained within a housing, and wherein the housing of the second frame component includes at least one opening configured to allow at least one cable to pass from the first frame component to the second frame component.

2. An uninterruptible power supply system comprising:
a first frame component adapted to hold a plurality of modules including at least one power module and at least one battery module;
a second frame component adapted to hold a plurality of modules including at least one battery module, wherein the second frame component is removably coupled to the first frame; and
a front door coupled to the first frame component and the second frame component.

3. The uninterruptible power supply system of claim 2, further comprising a first support member coupled to a first side of the first frame component and a first side of the second frame component.

4. The uninterruptible power supply system of claim 3, further comprising a second support member coupled to a second side of the first frame component and a second side of the second frame component.

5. The uninterruptible power supply system of claim 4, further comprising a first side piece configured to cover the first side of the first frame component and the first side of the second frame component, and a second side piece configured to cover the second side of the first frame component and the second side of the second frame component.

6. The uninterruptible power supply system of claim 2, further comprising at least one battery module contained in the second frame component in a first orientation and at least one battery module contained in the first frame component in a second orientation different from the first orientation.

7. A method of expanding a UPS system contained in a first frame component adapted to hold a plurality of modules including at least one power module and at least one battery module, the method comprising:
mechanically coupling a second frame component to the first frame component, the second frame component adapted to hold a plurality of modules including at least one battery module; and
installing at least one battery module in the second frame component;
wherein mechanically coupling includes mounting a first side support member to a first side of the first frame component and a first side of the second frame component; and
wherein mechanically coupling includes mounting a second side support member to a second side of the first frame component and to a second side of the second frame component.

8. The method of claim 7, further comprising mounting a first side cover over the first side of the first frame component and the first side of the second frame component, and mounting a second side cover over the second side of the first frame component and the second side of the first frame component.

9. The method of claim 7, further comprising mounting a first front door over a front side of the first frame component and a front side of the second frame component.

10. The method of claim 9, further comprising prior to mounting the first front door, removing a second front door from the front of the first frame component.

11. The method of claim 10, further comprising assembling the first door using at least one bezel component from the second door.

12. The method of claim 11, further comprising attaching the at least one bezel component to a frame of the first door.

13. A method of expanding a UPS system contained in a first frame component adapted to hold a plurality of modules including at least one power module and at least one battery module, the method comprising:
mechanically coupling a second frame component to the first frame component, the second frame component adapted to hold a plurality of modules including at least one battery module; and
installing at least one battery module in the second frame component;
wherein installing the at least one battery module in the first frame component includes installing the at least one battery module in a first rotational orientation in the first frame component, and wherein the method further comprises:
removing the at least one battery module from the first frame component; and
installing the at least one battery module in the second frame component with the at least one battery module in a second rotational orientation that is different from the first rotational orientation.

14. The method of claim 7, wherein mechanically coupling the second frame component to the first frame component includes placing the first frame component on a top surface of the second frame component.

15. The method of claim 14, further comprising mounting a plurality of castor components on a bottom surface of the second frame component.

* * * * *

UNITED STATES PATENT AND TRADEMARK OFFICE
CERTIFICATE OF CORRECTION

| | | |
|---|---|---|
| PATENT NO. | : 8,854,824 B2 | Page 1 of 1 |
| APPLICATION NO. | : 13/453487 | |
| DATED | : October 7, 2014 | |
| INVENTOR(S) | : James Edward Briggs et al. | |

It is certified that error appears in the above-identified patent and that said Letters Patent is hereby corrected as shown below:

In the Specification:

At Column 10, line number 21, delete "to".

At Column 11, line number 45, delete "to" between "embodiment," and "includes".

Signed and Sealed this
Sixth Day of January, 2015

Michelle K. Lee
*Deputy Director of the United States Patent and Trademark Office*